(12) United States Patent
Jeong et al.

(10) Patent No.: US 8,084,306 B2
(45) Date of Patent: Dec. 27, 2011

(54) METHODS OF FORMING SEMICONDUCTOR DEVICES HAVING SELF-ALIGNED BODIES

(75) Inventors: Jae-Hun Jeong, Gyeonggi-do (KR); Hoon Lim, Seoul (KR); Soon-Moon Jung, Gyeonggi-do (KR); Hoo-Sung Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 363 days.

(21) Appl. No.: 12/409,968

(22) Filed: Mar. 24, 2009

(65) Prior Publication Data

US 2009/0181511 A1    Jul. 16, 2009

Related U.S. Application Data

(62) Division of application No. 11/233,415, filed on Sep. 22, 2005, now abandoned.

(30) Foreign Application Priority Data

Sep. 24, 2004    (KR) .................. 10-2004-0076797

(51) Int. Cl.
*H01L 21/00*    (2006.01)
*H01L 21/84*    (2006.01)

(52) U.S. Cl. ........ 438/149; 438/151; 438/159; 438/197; 257/288; 257/347; 257/401; 257/E29.12; 257/E21.454; 257/E21.023

(58) Field of Classification Search .................. 257/288, 257/347, 401, E29.12, E21.023, E21.454; 438/149, 151, 159, 197

See application file for complete search history.

(56) References Cited

U.S. PATENT DOCUMENTS

| | | | |
|---|---|---|---|
| 5,082,794 A | 1/1992 | Pfiester et al. | |
| 5,891,783 A | 4/1999 | Lin et al. | |
| 6,100,564 A * | 8/2000 | Bryant et al. | 257/347 |
| 6,191,449 B1 * | 2/2001 | Shino | 257/347 |
| 6,528,847 B2 | 3/2003 | Liu | |
| 6,573,577 B1 * | 6/2003 | Iwata et al. | 257/401 |
| 6,706,569 B2 * | 3/2004 | Kim et al. | 438/149 |
| 6,753,574 B2 * | 6/2004 | Yamaguchi et al. | 257/331 |

(Continued)

FOREIGN PATENT DOCUMENTS

JP    2001-230423    8/2001

(Continued)

OTHER PUBLICATIONS

Hirano et al. "Impact of Actively Body-bias Controlled (ABC) SOI SRAM by using Direct Body Contact Technology for Low-Voltage Application," *IEDM '03 Technical Digest*. IEEE International Electron Devices Meeting, Dec. 8-10, 2003, pp. 2.4.1-2.4.4.

*Primary Examiner* — Meiya Li
(74) *Attorney, Agent, or Firm* — Myers Bigel Sibley & Sajovec

(57) ABSTRACT

A semiconductor device includes a body region having a source region, a drain region, a channel region interposed between the source region and the drain region, and a body region extension extending from an end of the channel region. A gate pattern is formed on the channel region and the body region, and a body contact connects the gate pattern to the body region. A sidewall of the body region extension is self-aligned to a sidewall of the gate pattern. Methods of forming semiconductor devices having a self-aligned body and a body contact are also disclosed.

5 Claims, 39 Drawing Sheets

U.S. PATENT DOCUMENTS

| | | |
|---|---|---|
| 2002/0119640 A1 | 8/2002 | Gonzalez |
| 2003/0025135 A1* | 2/2003 | Matsumoto et al. .......... 257/288 |
| 2003/0075719 A1 | 4/2003 | Sriram |
| 2003/0222313 A1 | 12/2003 | Fechner |
| 2005/0072975 A1* | 4/2005 | Chen et al. ..................... 257/66 |
| 2005/0179093 A1* | 8/2005 | Morris .......................... 257/371 |
| 2006/0019434 A1* | 1/2006 | Jeong et al. ................... 438/152 |

FOREIGN PATENT DOCUMENTS

| | | |
|---|---|---|
| JP | 2003-174172 | 6/2003 |
| KR | 100259593 B1 | 3/2000 |
| KR | 10-2003-0088874 A | 11/2003 |
| KR | 10-2004-0045904 A | 6/2004 |

* cited by examiner

METHODS OF FORMING SEMICONDUCTOR DEVICES HAVING SELF-ALIGNED BODIES

CLAIM OF PRIORITY AND CROSS REFERENCE TO RELATED APPLICATIONS

This application is a divisional of U.S. patent application Ser. No. 11/233,415 filed Sep. 22, 2005 now abandoned which claims priority to Korean Patent Application No. 2004-76797, filed on Sep. 24, 2004 in the Korean Intellectual Property Office, the disclosures of which are incorporated herein by reference in their entireties.

BACKGROUND OF THE INVENTION

1. Field of the Invention

The present invention relates to semiconductor devices, and, more particularly, to semiconductor devices having a body contact and methods of forming the same.

2. Description of the Related Art

As channel lengths of MOS (metal-oxide-semiconductor) transistor devices decrease, certain secondary effects, known as short channel effects, may decrease the performance of the devices. In a MOS transistor formed on an SOI (silicon on insulator) substrate, short channel effects may be suppressed due to full or partial depletion of the channel region. However, one drawback of SOI devices may be the accumulation of electrical charges in the body of the device. Such charge accumulation may increase the potential of the body region, which may result in a parasitic bipolar effect and/or a floating body effect such as the so-called kink phenomenon. The floating body effect may occur in an MOS transistor formed on an SOI substrate as well as in a thin film transistor having an isolated body.

By applying a bias to the body region of a transistor, electrical charges may be emitted from the body region, which may help to suppress the floating body effect. According to some conventional methods, the floating body effect may be suppressed by applying a body bias to a contact tied to both the gate and the body. Such a device may exhibit a lower threshold voltage when the transistor is turned on. Thus, the power consumption of the transistor may be reduced, and the transistor may operate at a higher switching speed.

A transistor having a body contact structure formed on an SOI substrate is disclosed in Tech. Dig., 2003 IEDM entitled "IMPACT OF ACTIVELY BODY-BIAS CONTROLLED (ABC) SOI SRAM BY USING DIRECT BODY CONTACT TECHNOLOGY FOR LOW-VOLTAGE APPLICATION" by Yuuichi Hirano et al.

A conventional semiconductor device 10 having a gate-body contact 40 is illustrated in FIG. 1. A body region 34 defined by a full trench isolation layer 36f and a partial trench isolation layer 36p is formed on a substrate 30 on which a buried insulation layer 32 is formed. Gate patterns 38a and 38b are formed to cross over the body region 34. A gate-body contact 40 is connected to the body region 34 through the partial trench isolation layer 36p. Thus, the electric potential of the body region 34 is controlled by contacting a portion of the body region 34 below the partial trench isolation layer 36p. When the device is turned off, charges accumulated in the body region 34 may be emitted via the gate-body contact 40. Since the electric potential of the body rises only when the device is turned on, the threshold voltage may drop, thereby reducing the stand-by current while shortening the device access time. Unfortunately, the process used to manufacture such a device may be complex.

Additionally, if the body region 34 and the gate pattern 38a are misaligned, the body region 34 may be exposed, which may result in the formation of an unwanted short circuit between the source and/or drain of the device and the body region 34.

SUMMARY OF THE INVENTION

According to some embodiments of the invention, semiconductor devices include a body region having a source region, a drain region, a channel region interposed between the source region and the drain region, and a body region extension extending from an end of the channel region. A gate pattern is formed on the channel region and the body region, and a body contact connects the gate pattern to the body region. A sidewall of the body region extension is self-aligned to a sidewall of the gate pattern.

In some embodiments, the body region is formed on an insulation layer, e.g., the insulation layer of an SOI substrate.

In some embodiments, the body contact may extend through the gate pattern to the body region. In some embodiments, the body contact may be formed on a surface of the gate pattern and in contact with a sidewall of the body region.

In some embodiments according to the invention, at least one of the source region or the drain region includes a portion elevated to have a height greater than a height of the channel region and/or the body region extension.

In some embodiments a semiconductor device according to the invention includes a sidewall spacer formed on a sidewall of the gate pattern. The source region and the drain region may be adjacent to the sidewall spacer.

In some embodiments according to the invention, the channel region and the body region have the same conductivity type and the body region is more heavily doped than the channel region.

Semiconductor devices according to further embodiments of the invention include a semiconductor substrate, an active region defined in the semiconductor substrate, a lower gate pattern crossing over the active region, and an interlayer dielectric covering the active region and the lower gate pattern. A body region may be formed on the interlayer dielectric, an upper gate pattern may be formed on the body region, and a body contact may be formed to electrically connect the upper gate pattern and the body region to the lower gate pattern. In some embodiments, the body region may include a source region and a drain region, a channel region interposed between the source region and the drain region, and a body region extension extending from one end of the channel region to be in contact with the body contact. In some embodiments, a sidewall of the body region extension is self-aligned to a sidewall of the upper gate pattern.

In some embodiments, the body region at least partially overlaps the lower gate pattern. In further embodiments, a contact pattern electrically connects the source region or the drain region to the active region.

In some embodiments, the body contact may extend through the gate pattern to the body region. In some embodiments, the body contact may be formed on a surface of the gate pattern and in contact with a sidewall of the body region.

In some embodiments according to the invention, at least one of the source region or the drain region includes a portion elevated to have a height greater than a height of the channel region and/or the body region extension.

In some embodiments, a semiconductor device according to the invention includes a sidewall spacer formed on a sidewall of the gate pattern. The source region and the drain region may be adjacent to the sidewall spacer.

In some embodiments according to the invention, the channel region and the body region have the same conductivity type and the body region is more heavily doped than the channel region.

Methods of forming a semiconductor device according to some embodiments of the invention include forming a gate pattern on a semiconductor layer, forming a mask pattern to cover portions of the semiconductor layer disposed on opposite sides of and adjacent to the gate pattern, etching the semiconductor layer using the mask pattern and the gate pattern as an etch mask to form a body region having a sidewall aligned to the gate pattern, selectively doping portions of the body region disposed on opposite sides of and adjacent to the gate pattern to form a source region and a drain region and to define a channel region between the source region and the drain region, and forming a body region extension extending from an end of the channel region and away from the source and drain regions, and forming a body contact to electrically connect the gate pattern to the body region extension.

Some embodiments of these methods further include selectively doping the body region extension.

In some embodiments of the invention, forming the mask pattern includes forming a sidewall spacer on a sidewall of the gate pattern, forming a capping layer on the gate pattern, forming a semiconductor mask layer to cover the gate pattern and exposed portions of the semiconductor layer around the gate pattern, thinning the semiconductor mask layer to expose the capping layer, and patterning the semiconductor mask layer to form a mask pattern covering portions of the semiconductor layer disposed on opposite sides of and adjacent to the gate pattern. The semiconductor mask layer may be thinned, for example, by etching or chemical-mechanical polishing.

Some embodiments according to the invention further include selectively to doping the semiconductor mask pattern and the body region extension, and removing a top of the mask pattern to form a semiconductor pattern on the body region.

Further methods according to embodiments of the invention include defining an active region in a semiconductor layer, forming a lower gate pattern crossing over the active region, forming an interlayer dielectric over the lower gate pattern and the active region, forming a semiconductor layer on the interlayer dielectric, forming an upper gate pattern on the semiconductor layer, forming a mask pattern to cover portions of the semiconductor layer disposed on opposite sides of and adjacent to the upper gate pattern, etching the semiconductor layer using the mask pattern and the upper gate pattern as an etch mask to form a body region including a portion extending to opposite sides of the gate pattern and a body region extension having a sidewall extending along the upper gate pattern and aligned to a sidewall of the end of the upper gate pattern, selectively doping portions of the body region disposed on opposite sides of and adjacent to the upper gate pattern to form a source region and a drain region and to define a channel region between the source region and the drain region, and forming a body contact to electrically connect the upper gate pattern and the body region extension to the lower gate pattern.

Some embodiments according to the invention further include selectively doping the body region extension.

In some embodiments according to the invention, forming the mask pattern includes forming a sidewall spacer on a sidewall of the gate pattern, forming a capping layer on the gate pattern, forming a semiconductor mask layer to cover the gate pattern and exposed portions of the semiconductor layer around the gate pattern, thinning the semiconductor mask layer to expose the capping layer, and patterning the semiconductor mask layer to form a mask pattern covering portions of the semiconductor layer disposed on opposite sides of and adjacent to the gate pattern. Thinning the semiconductor mask layer may include chemical-mechanical polishing of the semiconductor mask layer.

Some embodiments according to the invention further include implanting impurities into the semiconductor mask pattern and the body region extension and removing a top of the mask pattern to form a semiconductor pattern on the body region.

In some embodiments according to the invention, forming the body contact includes forming an upper dielectric on an entire surface of the resulting structure where the source and drain regions are formed; forming a contact hole through the upper dielectric, the upper gate pattern, the body region, and the lower interlayer dielectric to expose the lower gate pattern, and filling the contact hole with a conductive layer to form a body contact.

In further embodiments according to the invention, forming the body contact includes forming an upper dielectric on an entire surface of the resulting structure where the source region and the drain region are formed, forming a contact hole through the upper dielectric and the lower interlayer dielectric to expose the upper gate pattern, a sidewall of the body region, and the lower gate pattern, and filling the contact hole with a conductive layer to form a body contact electrically connecting the upper gate pattern and the sidewall of the body region to the lower gate pattern.

Some embodiments of the invention are directed to a semiconductor device having a body region insulated by an insulation layer but which may be formed without using complex processes that may be needed for forming a partially insulated body region. In some embodiments, the present invention may provide a body region in which the portion of the body region to which a body contact is connected extends from the end of the channel region. Some embodiments of the invention are directed to methods of forming such devices.

Some embodiments of the invention are directed to a structure having self-aligned body and gate regions. Self alignment of the body and gate regions may reduce the possibility of the formation of a short circuit between the body region and the source and/or drain region. Some embodiments of the invention are directed to methods of forming such devices.

DETAILED DESCRIPTION

Figure 1:
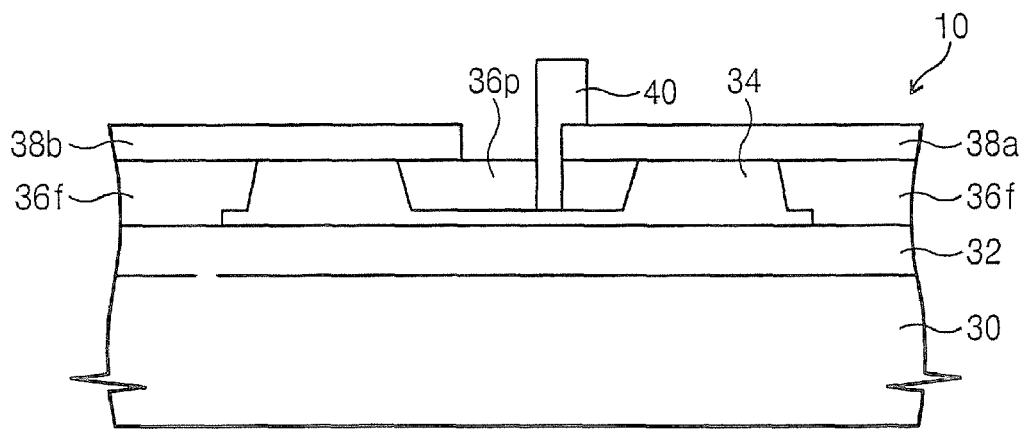
FIG. 1 is a cross-sectional view of a conventional device having a body contact.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" or "connected to" another element or layer, it can be directly on or directly connected to the other element or layer or intervening elements or layers may be present.

Like reference numerals refer to like elements throughout. As used herein the term "and/or" includes any and all combinations of one or more of the associated listed items.

It will be understood that, although the terms first, second, etc. may be used herein to describe various elements, components or layers, these elements, components or layers should not be limited by these terms. These terms are only used to distinguish one element, component or layer from another element, component or layer. Thus, a first element, component or layer discussed below could be termed a second element, component or layer without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It will also be appreciated by those of skill in the art that references to a structure or feature that is disposed "adjacent" another feature may have portions that overlap or underlie the adjacent feature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements or components, but do not preclude the presence or addition of one or more other features, elements or components.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described with reference to semiconductor devices with a MOS structure. However, the invention is not limited to a semiconductor device with a MOS structure, and can be employed in various structures by those skilled in the art.

Figure 2A:
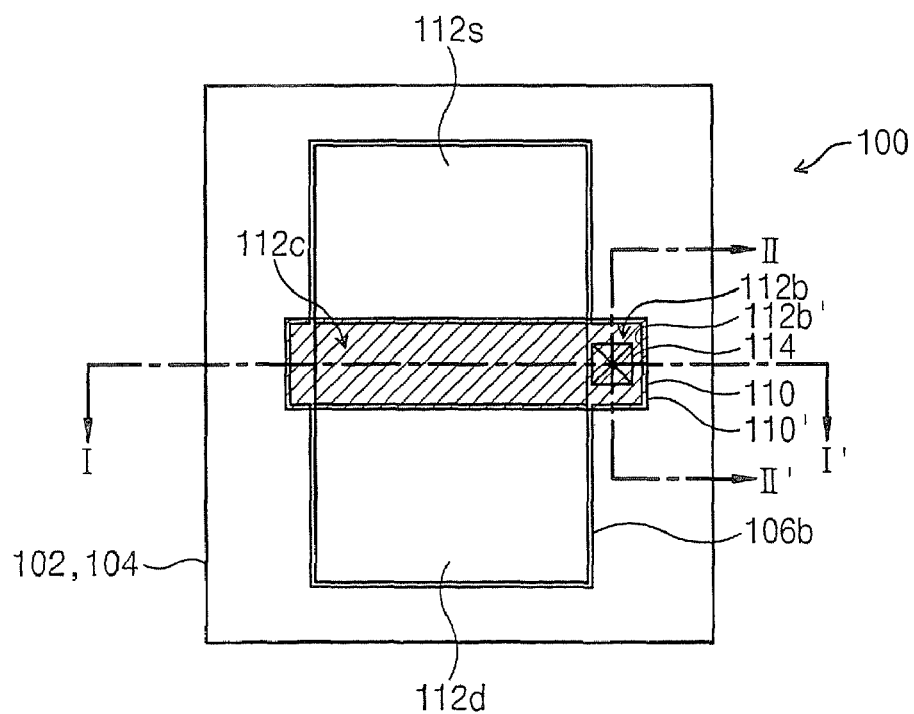
FIG. 2A is a top plan view of a semiconductor device according to some embodiments of the invention.
Figure 2B:
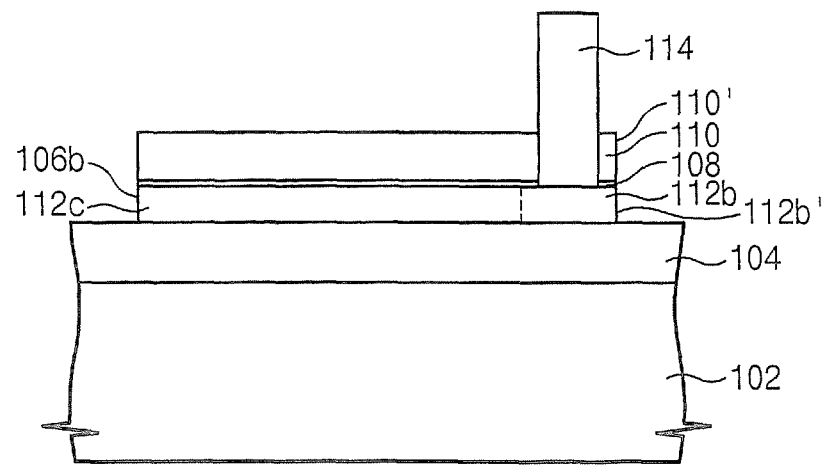
FIG. 2B is a cross-sectional view taken along a line I-I' of FIG. 2A.

FIG. 2A is a plan view of a semiconductor device 100 according to some embodiments of the invention. FIG. 2B is a cross-sectional view taken along a line I-I' of FIG. 2A, and FIG. 2C is a cross-sectional view taken along a line II-II' of FIG. 2A.

Figure 2C:
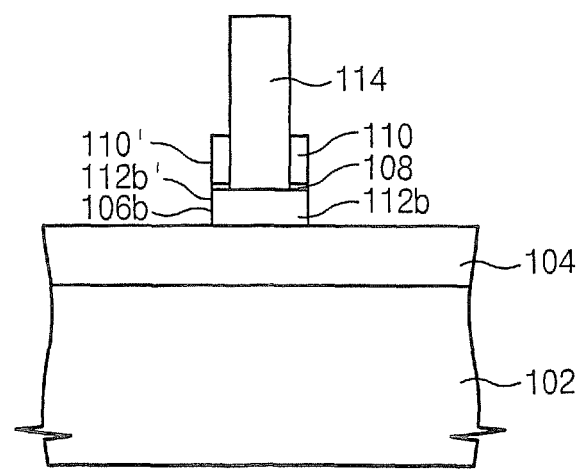
FIG. 2C is a cross-sectional view taken along a line II-II' of FIG. 2A.

As illustrated in the embodiments of FIG. 2A, FIG. 2B, and FIG. 2C, the semiconductor device 100 may be formed on an SOI substrate. A semiconductor body region 106b may be formed on a substrate 102 and a buried insulation layer 104. A gate pattern 110 may be formed on the body region 106b with a gate insulation layer 108 interposed between the body region 106b and the gate pattern 110.

As illustrated in FIG. 2A, the body region 106b may include a source region 112s and a drain region 112d formed at opposite sides of and adjacent to the gate pattern 110, a channel region 112c formed between the source region 112s and the drain region 112d, and a body region extension 112b extending outwardly from an end of the channel region 112c away from source region 112s and drain region 112d. Body region extension 112b may have a sidewall 112b' aligned to a sidewall 110' of the gate pattern 110.

As illustrated in FIG. 2B and FIG. 2C, a body contact 114 formed on body region extension 112b connects the body region 106b to the gate pattern 110 through the gate insulation layer 108. The body region extension 112b may be aligned to a bottom portion of the gate pattern 110. Thus, the body region extension 112b may exist below the portion of the gate pattern 110 that extends outwardly away from the source region 112s and the drain region 112d. As noted above, the body region extension 112b may have a sidewall 112b' aligned to a sidewall 110' of the gate pattern 110.

The channel region 112c and the body region extension 112b may be doped with impurity atoms of the same conductivity type. The body region extension 112b may be doped more heavily than the channel region 112c.

Figure 3A:
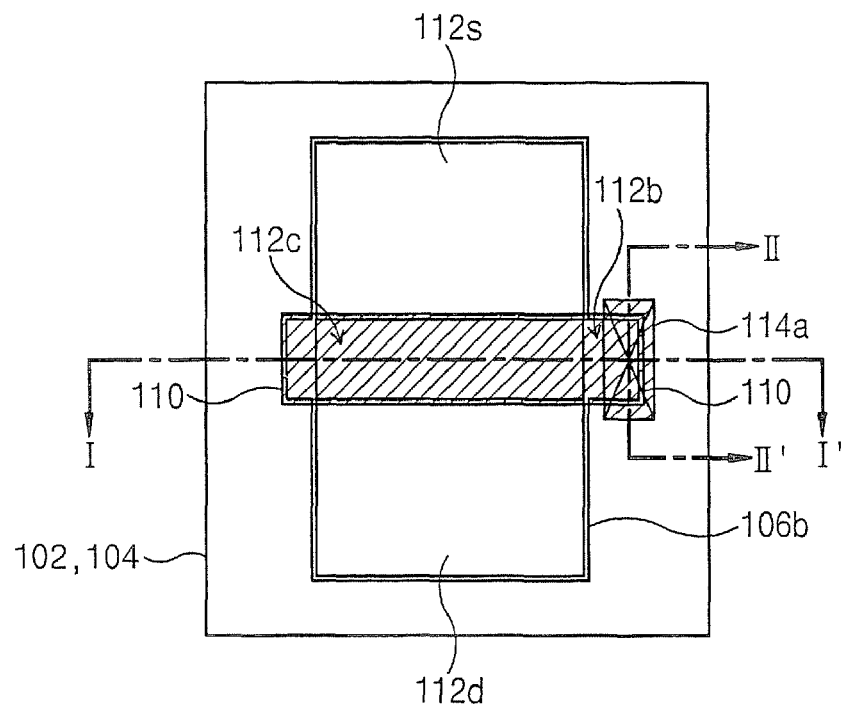
FIGS. 3A, 4A, 5A and 6A are plan views illustrating methods of fabricating semiconductor devices according to the some embodiments of the invention.
Figure 3B:
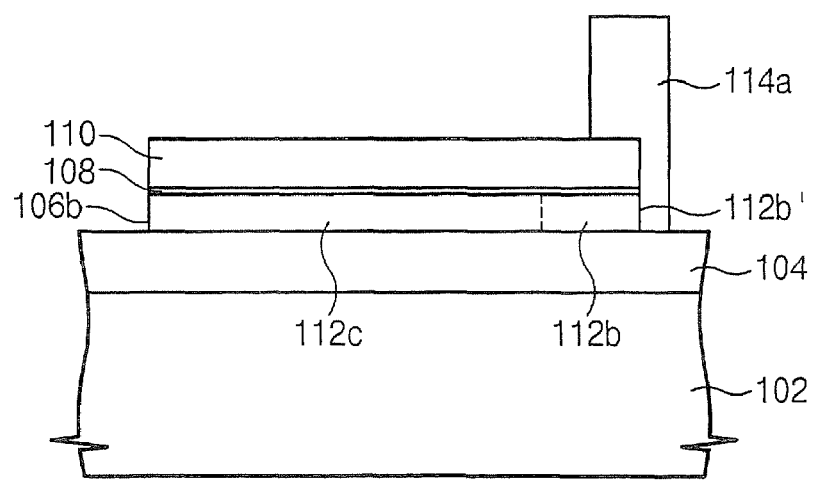
FIGS. 3B, 4B 5B and 6B are cross-sectional views taken along lines I-I' of FIG. 3A, 4A, 5A and 6A, respectively.
Figure 3C:
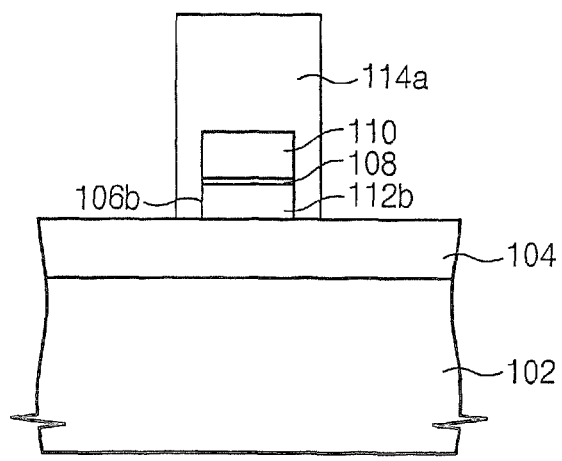
FIGS. 3C, 4C, 5C and 6C are cross-sectional views taken along lines II-II' of FIGS. 3A, 4A, 5A and 6A, respectively.

A semiconductor device according to further embodiments of the invention is illustrated in FIG. 3A, FIG. 3B, FIG. 3C. Similar to the embodiment illustrated in FIGS. 2A-2C, a gate pattern 110 may be formed on a body region 106b with a gate insulation layer 108 interposed between the body region 106b and the gate pattern 110. A body contact 114a connecting the gate pattern 110 with the body region extension 112b may be partially formed over the gate pattern 110 such that it connects to a sidewall 112b' of the body region extension 112b. In some embodiments, the body contact 114a may connect to the body region extension 112b without penetrating the gate pattern 110. Thus, the gate pattern 110 and the body region 112b may be electrically connected to each other by the body contact 114a.

Figure 4A:
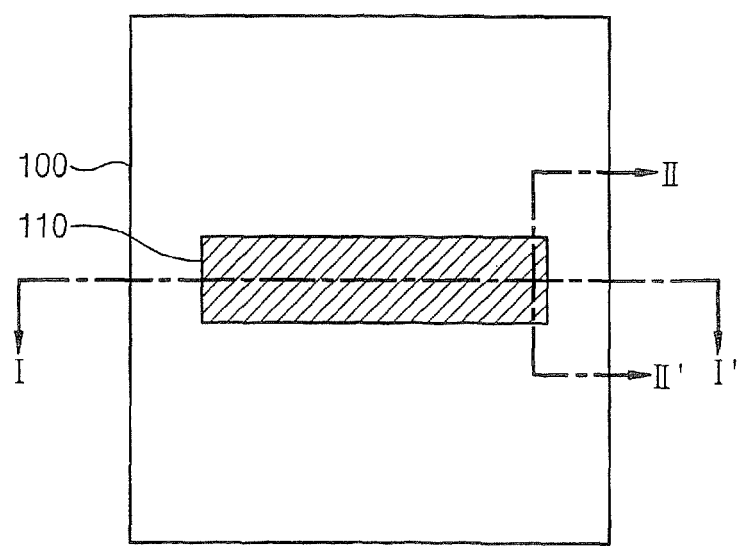
Figure 4B:
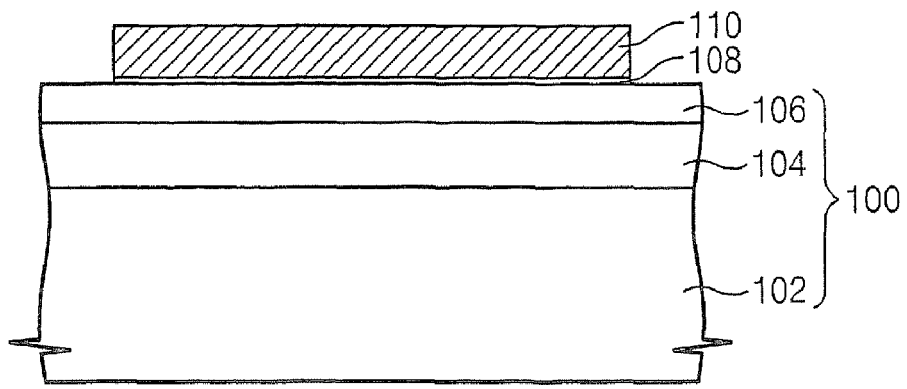
Figure 4C:
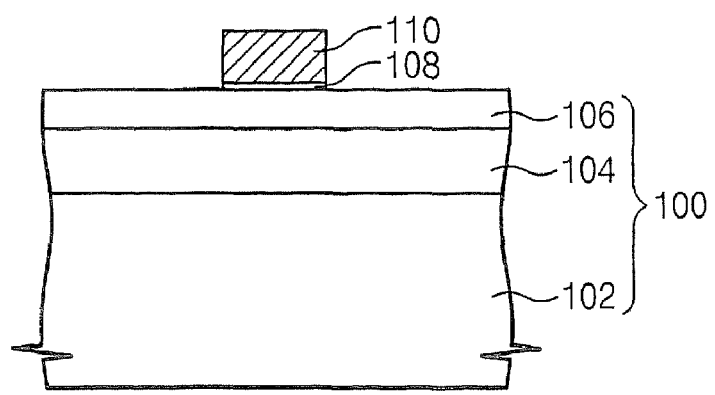
Figure 5A:
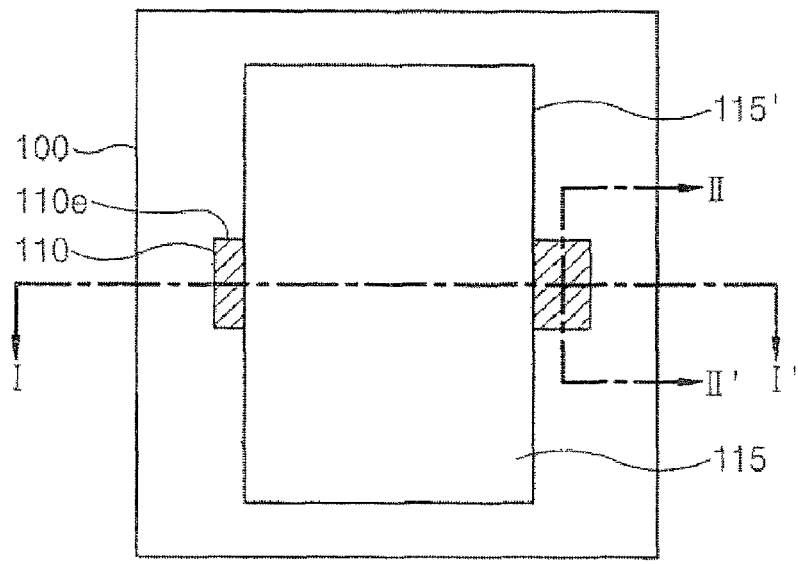
Figure 5B:
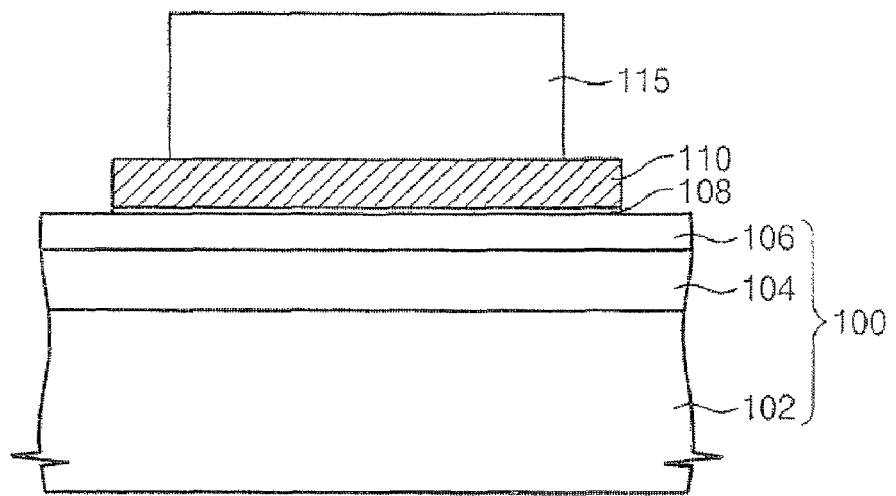
Figure 5C:
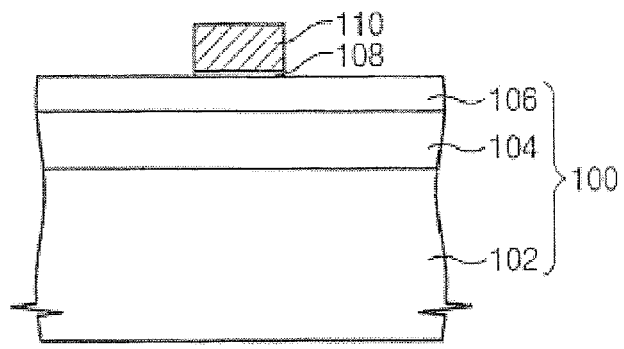
Figure 6A:
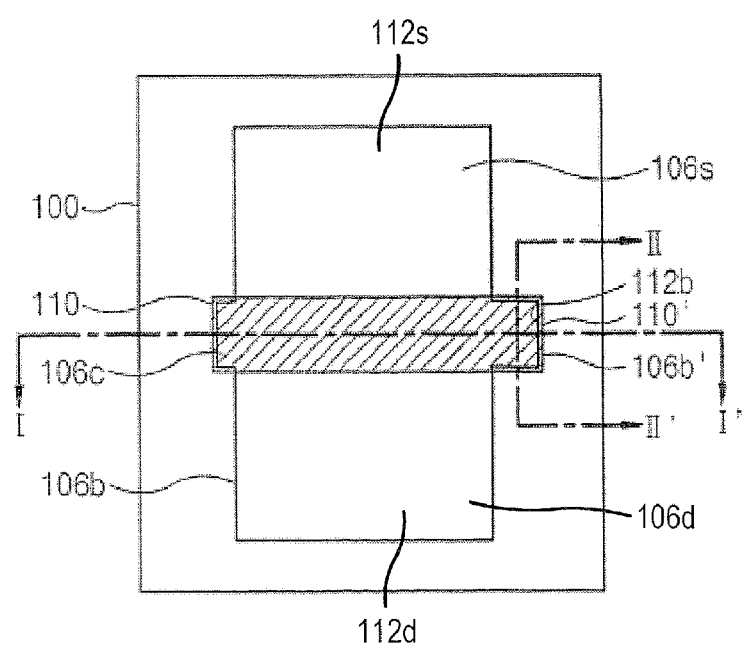
Figure 6B:
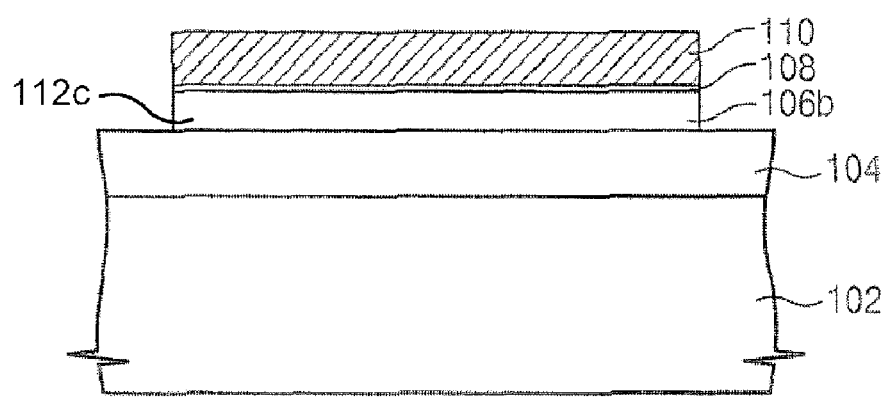
Figure 6C:
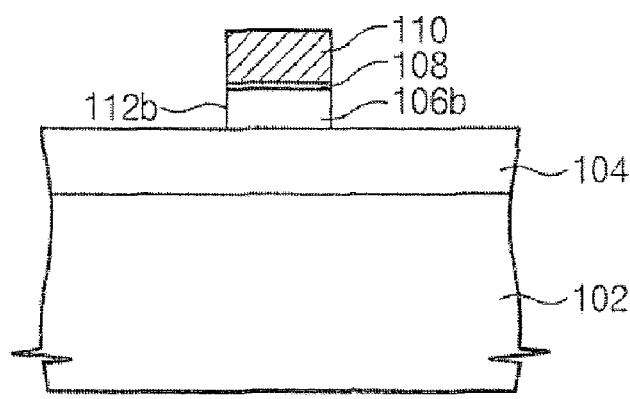
Figure 7A:
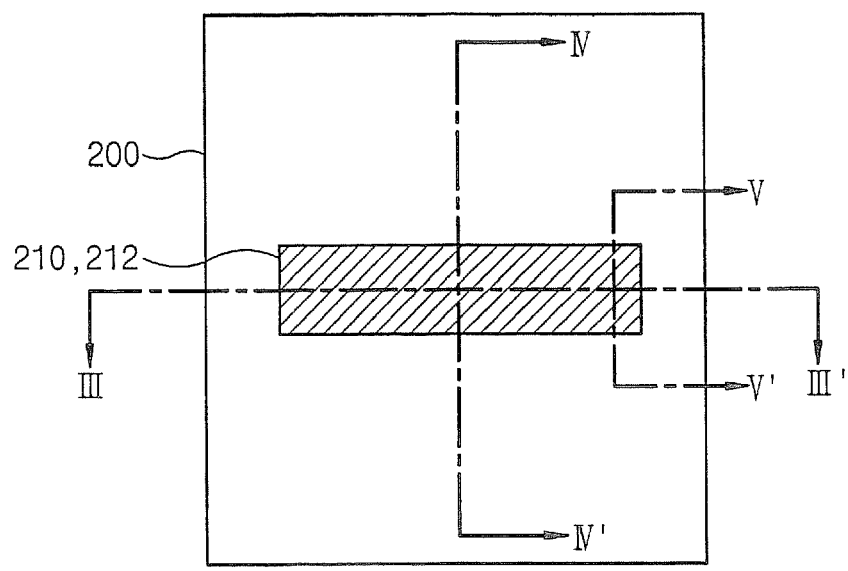
FIGS. 7A, 8A, 9A and 10A are plan views illustrating methods of fabricating semiconductor devices according to further embodiments of the invention.
Figure 7B:
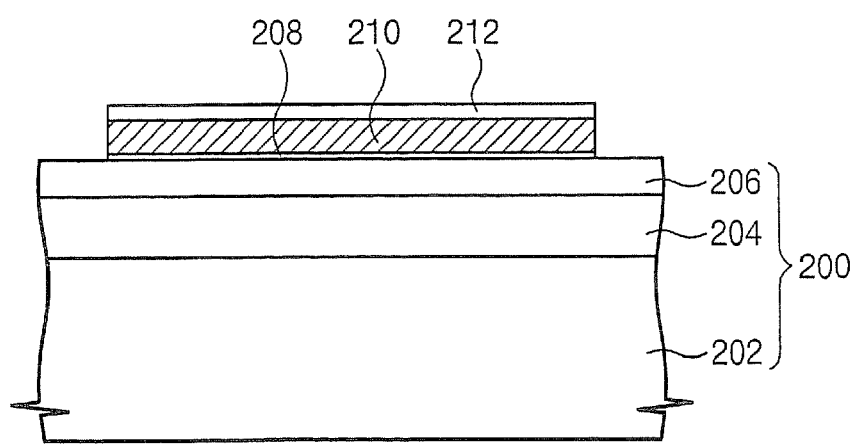
FIGS. 7B, 8B, 9B and 10B are cross-sectional views taken along lines III-III' of 7A, 8A, 9A and 10A, respectively.
Figure 7C:
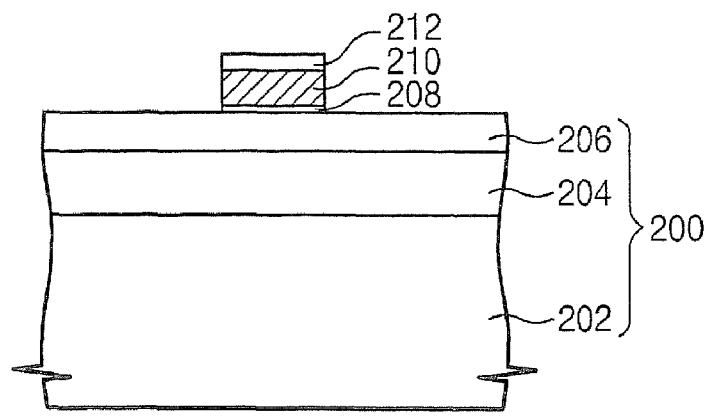
FIGS. 7C, 8C, 9C and 10C are cross-sectional views taken along lines IV-IV' of 7A, 8A, 9A and 10A, respectively.
Figure 7D:
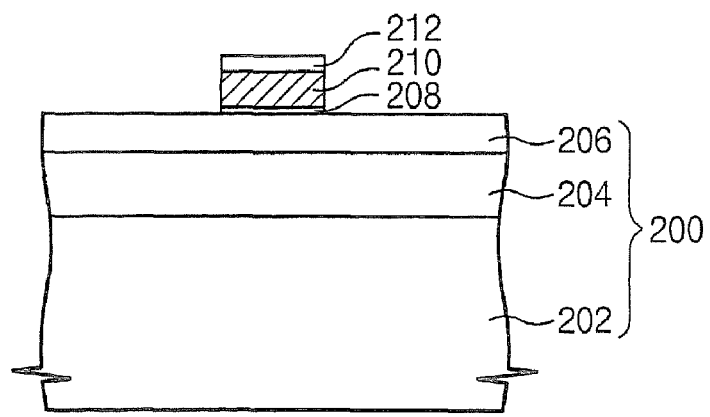
FIGS. 7D, 8D, 9D and 10D are cross-sectional views taken along lines V-V' of FIGS. 7A, 8A, 9A and 10A, respectively.

FIG. 4A, FIG. 5A and FIG. 6A are plan views illustrating methods of forming semiconductor devices according to the embodiments of the invention. FIG. 4B, FIG. 5B and FIG. 6B are cross-sectional views taken along lines I-I' of FIG. 4A through FIG. 6A, respectively. FIG. 4C, FIG. 5C and FIG. 6C are cross-sectional views taken along lines II-II' of FIG. 4A, FIG. 5A and FIG. 6A, respectively.

As illustrated in the embodiments of FIG. 4A, FIG. 4B, and FIG. 4C, a gate pattern 110 may be formed on an SOI substrate 100 above a gate insulation layer 108 formed on the substrate 100. The SOI substrate 100 may, for example, include a substrate 102, a buried insulation layer 104, and a semiconductor layer 106. The gate pattern 110 may include an overlying capping layer (not shown).

As illustrated in FIG. 5A, FIG. 5B, and FIG. 5C, a mask pattern 115 may be formed to cross over the gate pattern 110 in a direction transverse to the orientation of the gate pattern 110. The mask pattern 115 may cover a portion of the gate pattern 110. The gate pattern 110 may extend beyond the sides 115' of the mask pattern 115 in one and/or both directions to form at least one gate extension region 110e. The mask pattern 115 may be made of photoresist or any other suitable mask material.

As illustrated in FIG. 6A, FIG. 6B, and FIG. 6C, using the mask pattern 115 and the gate pattern 110 as an etch mask, the semiconductor layer 106 may be etched to define a body region 106b. The combined pattern formed by the mask pattern 115 and the gate pattern 110 may result in the body region 106b having a central portion 106c extending along the gate pattern 110 and respective side portions 106s, 106d extending toward opposite sides of the gate pattern 110. Since the portion of the body region 106b extending beyond the sides of the mask pattern 115 is partially masked by the gate pattern 110, the resulting body region 106b may have a sidewall 106b' self-aligned to a sidewall 110' of the gate pattern 110.

Side portions 106s, 106d of the body region 106b disposed at opposite sides of and adjacent to the gate pattern 110 may be selectively doped, e.g., by ion implantation, to form a source region 112s and a drain region 112d, respectively. Channel region 112c is interposed between the source region 112s and the drain region 112d beneath the gate pattern 110. A body region extension 112b extends from the end of the channel region 112c along the gate pattern 110 and outside the region defined by mask 115. The body region extension 112b and the channel region 112c may be doped with impurity atoms of the same conductivity type. In some embodiments, the body region extension 112b may be more heavily doped than the channel region 112c.

The gate pattern 110 and the gate insulation layer 108 are patterned to form a body contact 114 that is connected to the body region 106 through the gate pattern 110 (see FIG. 2) or to form a body contact 114 that is partially laid over the gate pattern 110 and is connected to a sidewall of the body region 106 (see FIG. 3).

FIG. 7A, FIG. 8A, FIG. 9A and FIG. 10A are plan views illustrating methods of forming semiconductor devices according to further embodiments of the invention. FIG. 7B, FIG. 8B, FIG. 9B and FIG. 10B are cross-sectional views taken along lines III-III' of FIG. 7A, FIG. 8A, FIG. 9A and FIG. 10A, respectively. FIG. 7C, FIG. 8C, FIG. 9C and FIG. 10C are cross-sectional views taken along lines IV-IV' of FIG. 7A, FIG. 8A, FIG. 9A and FIG. 10A, respectively. FIG. 7D, FIG. 8D, FIG. 9D and FIG. 10D are cross-sectional views taken along lines V-V' of FIG. 7A, FIG. 8A, FIG. 9A and FIG. 10A, respectively.

As illustrated in the embodiments of FIG. 7A, FIG. 7B, FIG. 7C, and FIG. 7D, a gate pattern 210 may be formed on an SOI substrate 200 with a gate insulation layer 208 interposed between the substrate 200 and the gate pattern 210. The SOI substrate 200 may include a substrate 202, a buried insulation layer 204 on the substrate, and a semiconductor layer 206 on the insulation layer 204. A capping layer 212 may be formed on the gate pattern 210.

Figure 8A:
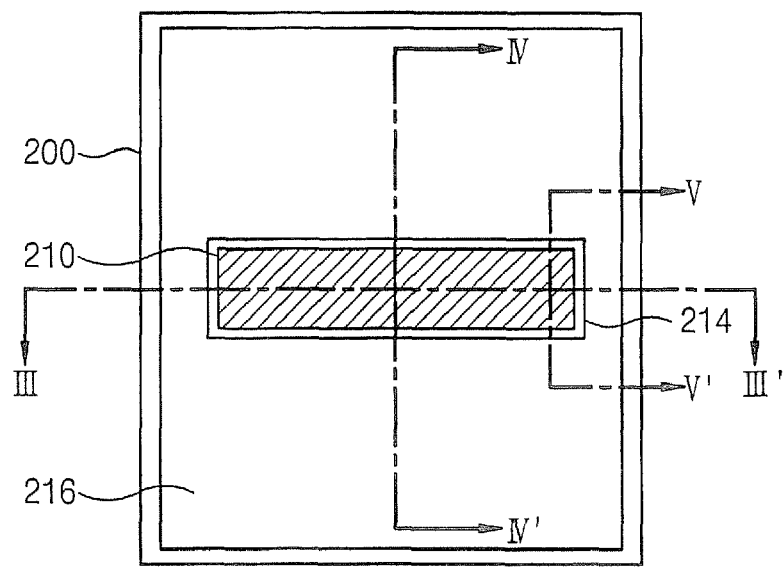
Figure 8B:
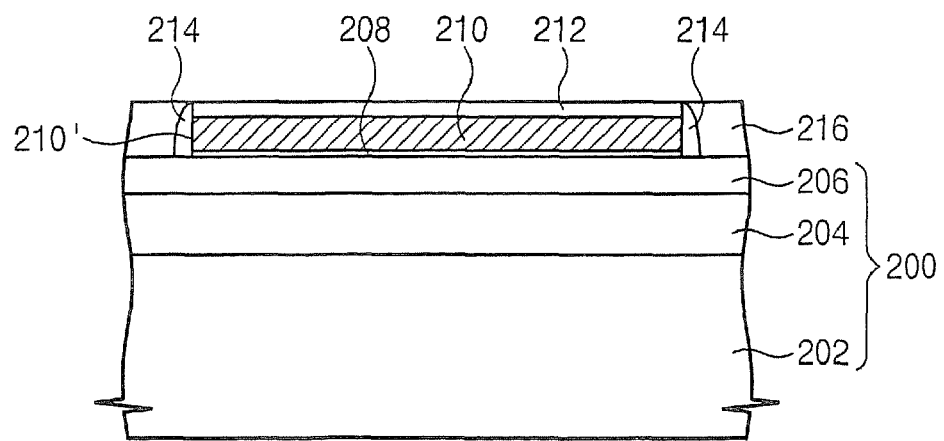
Figure 8C:
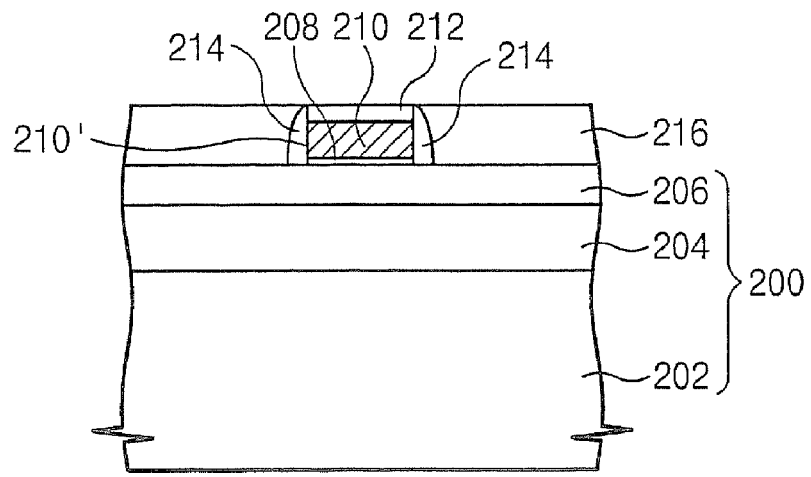
Figure 8D:
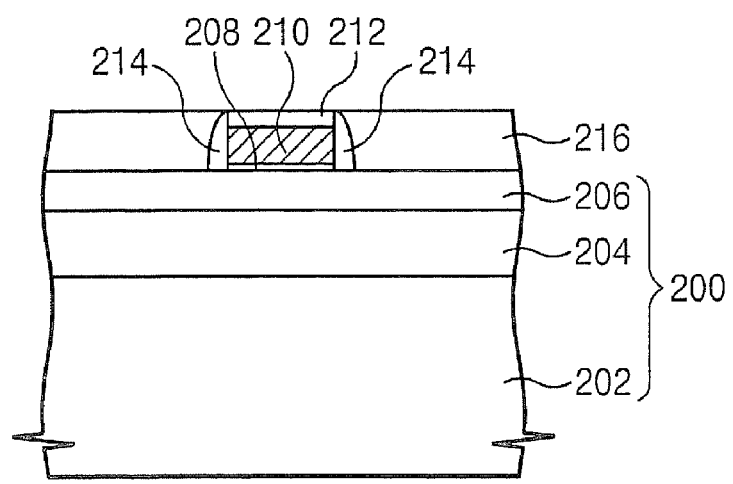
Figure 9A:
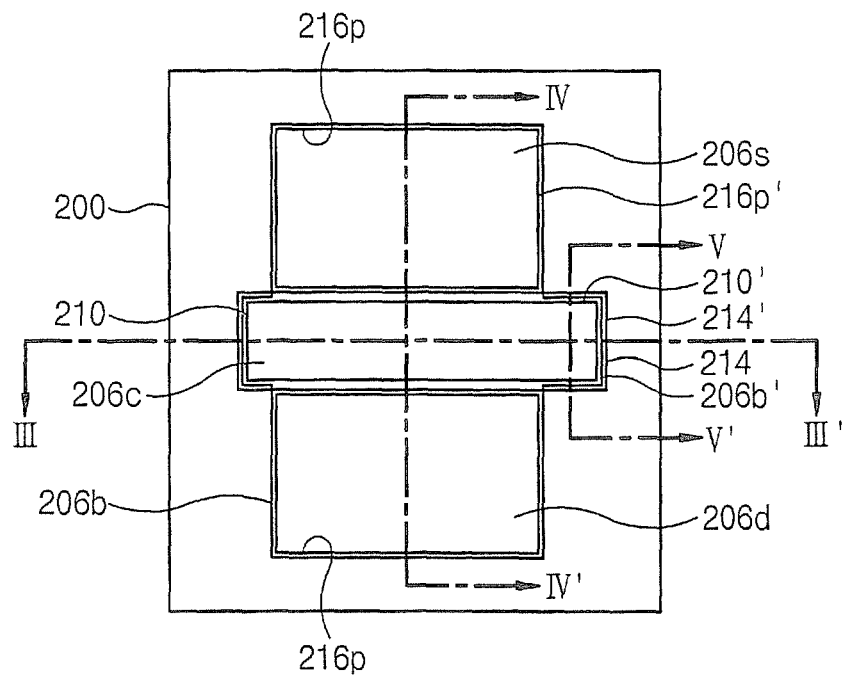
Figure 9B:
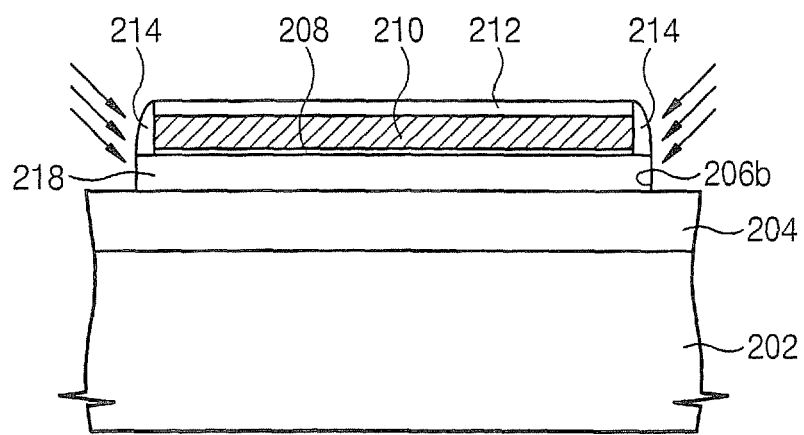
Figure 9C:
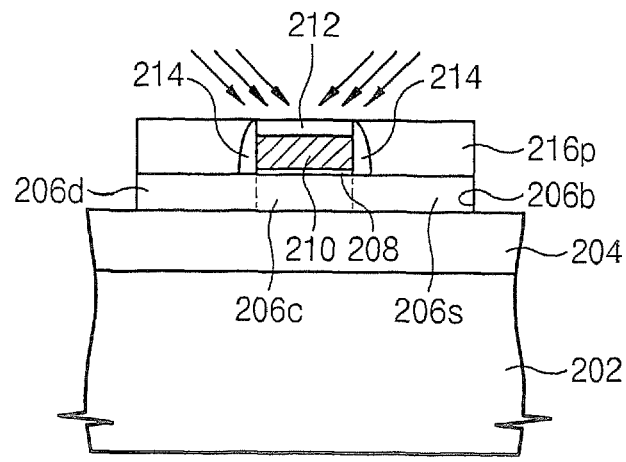
Figure 9D:
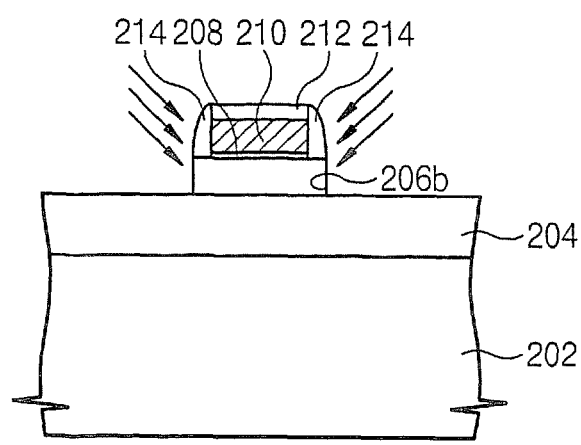

As illustrated in the embodiments of FIG. 8A, FIG. 8B, FIG. 8C, and FIG. 8D, a sidewall spacer 214 may be formed on a sidewall 210' of the gate pattern 210. Prior to formation of the sidewall spacer 214, a lightly doped diffusion layer may be formed in the semiconductor layer 206 disposed at opposite sides adjacent to the gate pattern 210 or an ion implanting process may be performed to form a lightly doped diffusion layer or a pocket diffusion layer. An upper semiconductor layer 216 may be formed on the structure over semiconductor layer 206 and gate pattern 210. The upper semiconductor layer 216 may be thinned to expose the capping layer 212. The upper semiconductor layer 216 may be thinned, for example, using an etch-back process or chemical-mechanical polishing (CMP). As illustrated in FIG. 8B, the upper semiconductor layer 216 and the gate pattern 210 may be insulated from each other by the capping layer 212 and the sidewall spacer 214.

As illustrated in the embodiments of FIG. 9A, FIG. 9B, FIG. 9C, and FIG. 9D, the semiconductor layer 206 may be patterned to form a body region of a semiconductor device. This may be accomplished, for example, by forming photoresist pattern (not shown) to cross over the gate pattern 210. Using the photoresist pattern as an etch mask, the upper semiconductor layer 216 may be patterned to form a mask pattern 216p on opposing sides of and adjacent to the gate pattern 210. The ends of gate pattern 210 may extend beyond the sides 216p' of mask pattern 216p in one and/or both directions. That is, the mask pattern 216p may be formed from portions of the upper semiconductor layer 216 adjacent to a portion of the sidewall 210' of the gate pattern 210.

Using mask pattern 216p as an etch mask, the semiconductor layer 206 may be etched to form a body region 206b. Using a combined mask pattern of the mask pattern 216p and the gate pattern 210, the body region 206b may be formed to include portions 206s, 206d extending to opposite sides of the gate pattern 210 and a portion 206c extending along the gate pattern 210. Since the portion of the body region 206b extending away from the sides 216p' of the mask pattern is patterned below the gate pattern 210 and the sidewall spacer 214, it may have a sidewall 206b' self-aligned to a sidewall 214' of the sidewall spacer 214. The photoresist pattern may be removed after formation of the mask pattern 216p.

Figure 10A:
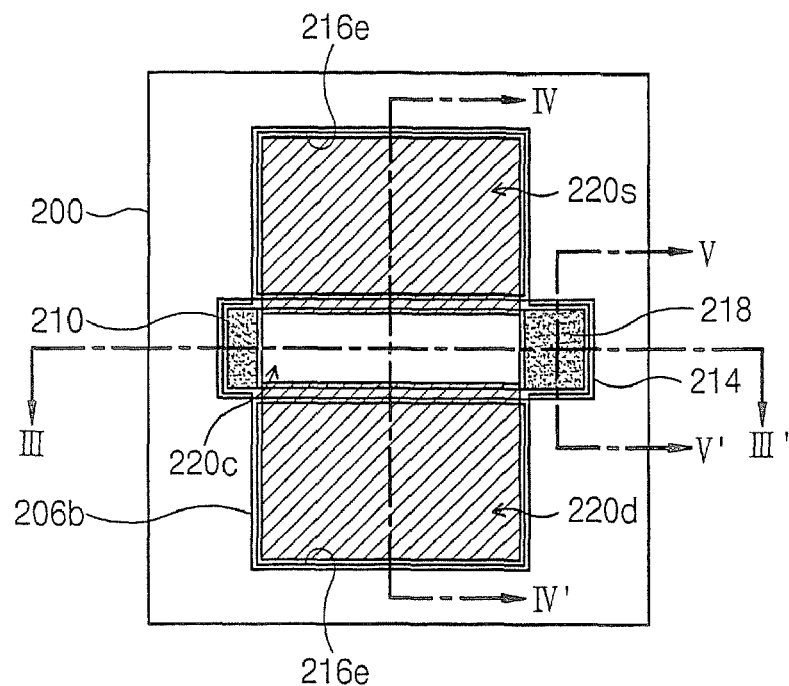
Figure 10B:
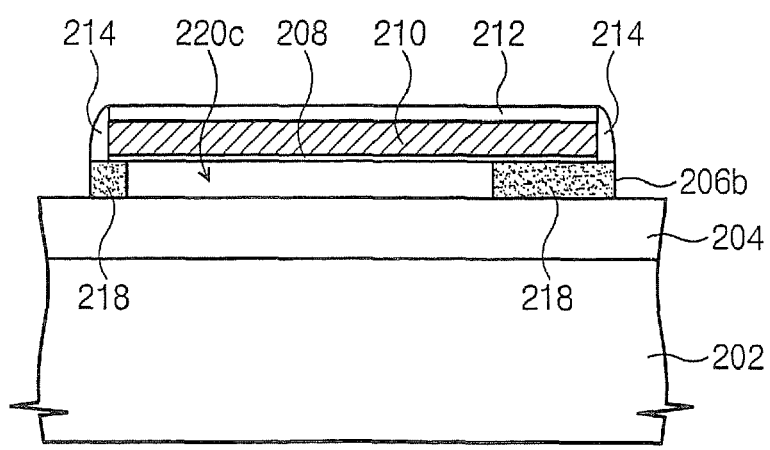
Figure 10C:
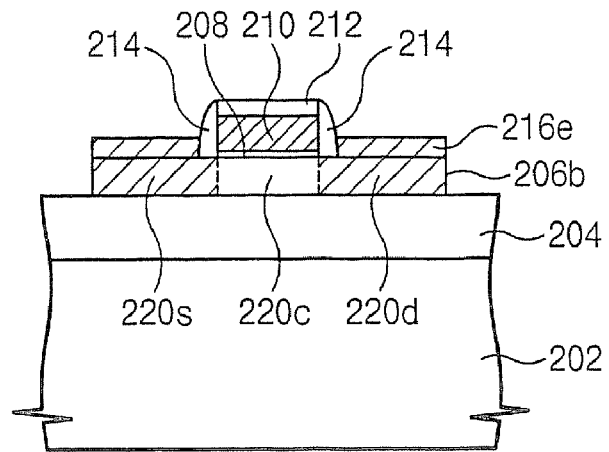
Figure 10D:
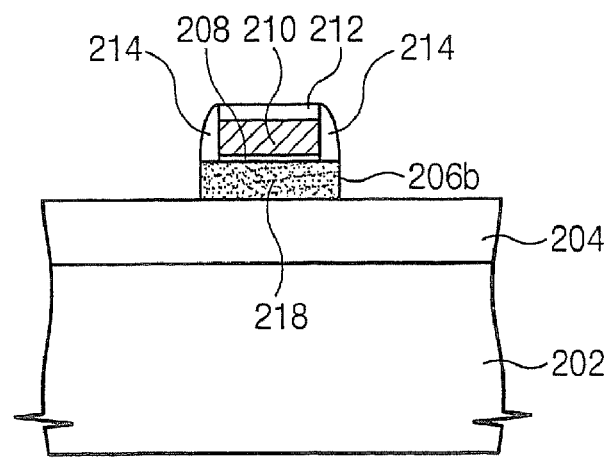

The portion of the body region 206b extending along the gate pattern 210 may be doped (e.g., by ion implantation) to form a body region extension 218 as shown in FIGS. 10A, 10B and 10D. The impurities may be obliquely implanted into the body region 206b below the gate pattern 210. Impurity atoms may also be implanted into a top of the mask pattern 216p.

As illustrated in the embodiments of FIG. 10A, FIG. 10B, FIG. 10C, and FIG. 10D, the top of the mask pattern 216p may be recessed to remove an impurity-implanted portion. Thus, a recessed semiconductor pattern 216e may remain on portions of the body region 206b disposed on opposite sides of and adjacent to the gate pattern 210. Although not shown in the figures, impurity atoms may be implanted into the semiconductor pattern 216e to form a source region 220s and a drain region 220d. The source and drain regions 220s and 220d may, for example, include a region of impurity atoms implanted through the semiconductor pattern 216e, a diffusion layer lightly doped in advance as described above, and/or a pocket diffusion layer as described above. As illustrated in FIG. 10C, a channel region 220c is defined between the source region 220s and the drain region 220d. Body region extensions 218 are formed by portions of body region 206b extending away from the ends of the channel region 220c as illustrated in FIG. 10B. The body region extensions 218 may be doped with impurity atoms of the same conductivity type as the channel region 220c. In some embodiments, the body region extensions 218 may be doped more heavily than the channel region 220c. Although FIGS. 10A and 10B show the body region extensions 218 formed at both ends of the channel region 220c, it will be appreciated that, in some embodiments, a body region extension 218 may be formed on only one end of the channel region 220c. The source region 220s and the drain region 220d may include portions of the semiconductor pattern 216e (see FIG. 10C). Accordingly, the source and drain regions 220s and 220d may form an elevated source/drain structure including a portion taller than the channel region 220c and the body region extension(s) 218.

Figure 11:
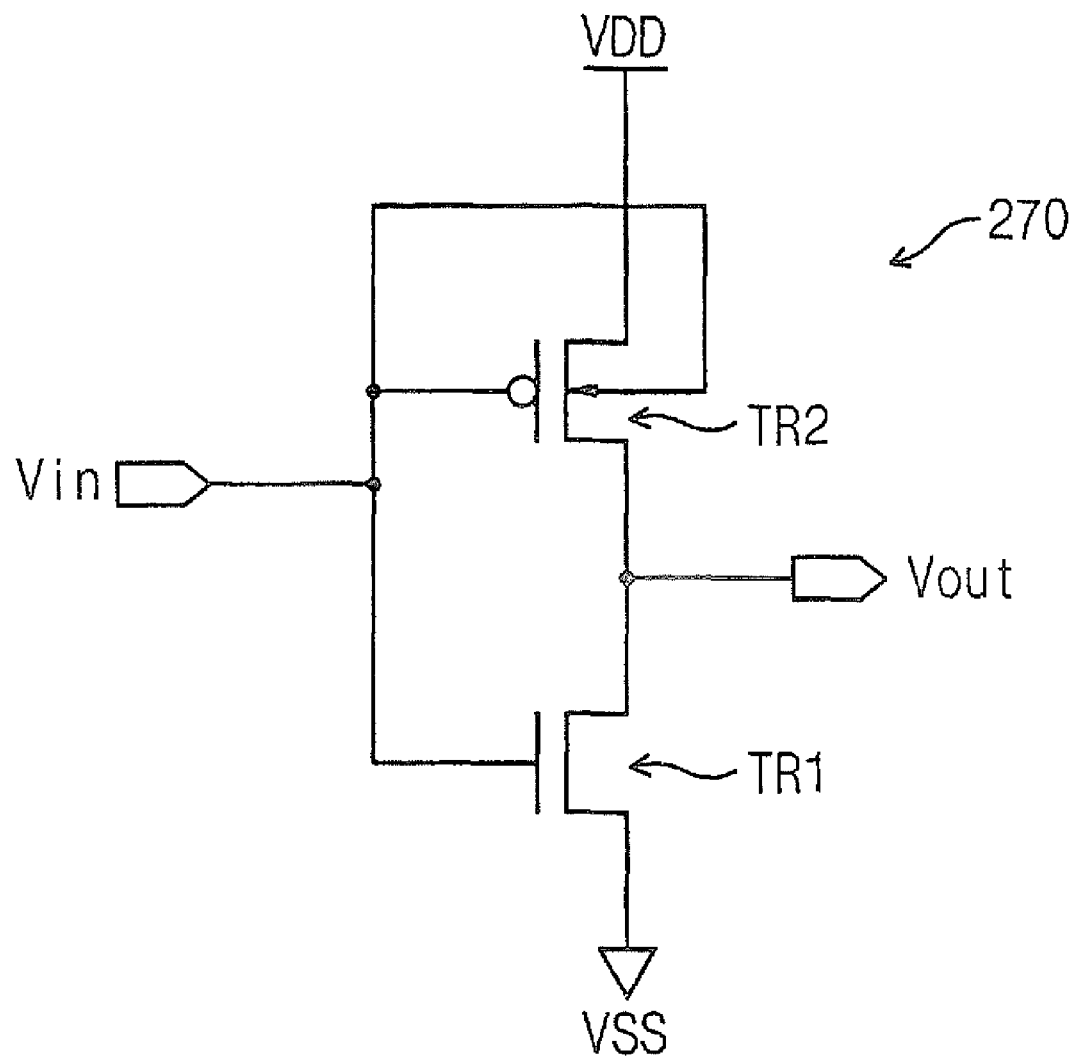
FIG. 11 is an equivalent circuit diagram of semiconductor devices formed in accordance with some embodiments of the invention.

An equivalent circuit diagram of a semiconductor device 270 formed in accordance with embodiments of the invention is illustrated in FIG. 11. A semiconductor device 270 according to embodiments of the invention may form a complementary MOS (CMOS) device which includes a driver transistor TR1 and a load transistor TR2. The driver transistor TR1 may be an NMOS transistor, while the load transistor TR2 may be a PMOS transistor. In a typical CMOS device, the driver transistor TR1 and the load transistor TR2 are serially connected to each other. That is, the drain of the driver transistor TR1 is connected to the source of the load transistor TR2. The source of the driver transistor TR1 may be connected to a ground connection VSS, and the drain region of the load transistor TR2 may be connected to a voltage source VDD.

The gate electrodes of the load transistor TR2 and the driver transistor TR1 may be connected to an input terminal Vin, and the drain of the driver transistor TR1 and the source of the load transistor TR2 may be connected to an output terminal Vout. The body and the gate electrode of the load transistor TR2 are connected to each other. While not illustrated in FIG. 11, the body and the gate electrode of the driver transistor TR1 may likewise be connected to each other. The CMOS device, for example, may be an element of a semiconductor memory cell, such as a static random access memory (SRAM) cell.

Figure 12A:
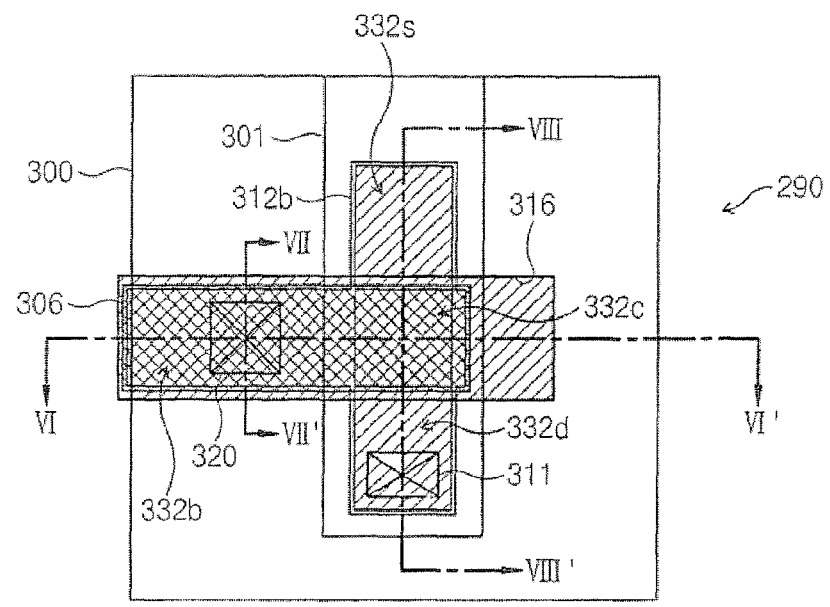
FIG. 12A is a plan view of semiconductor devices according to further embodiments of the invention.
Figure 12B:
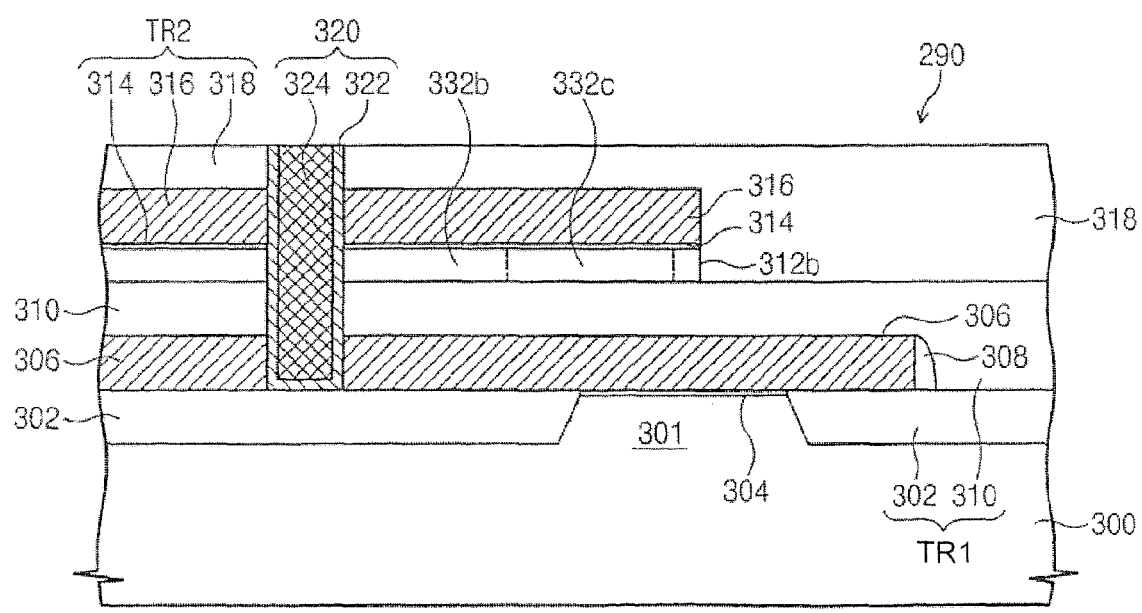
FIG. 12B is a cross-sectional view taken along a line VI-VI' of FIG. 12A.
Figure 12C:
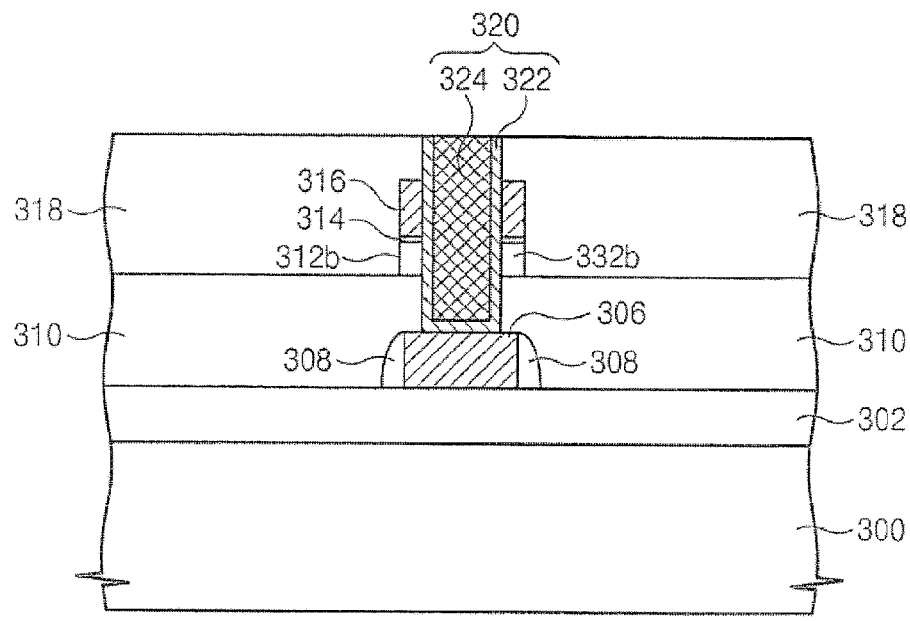
FIG. 12C is a cross-sectional view taken along a line VII-VII' of FIG. 12A.
Figure 12D:
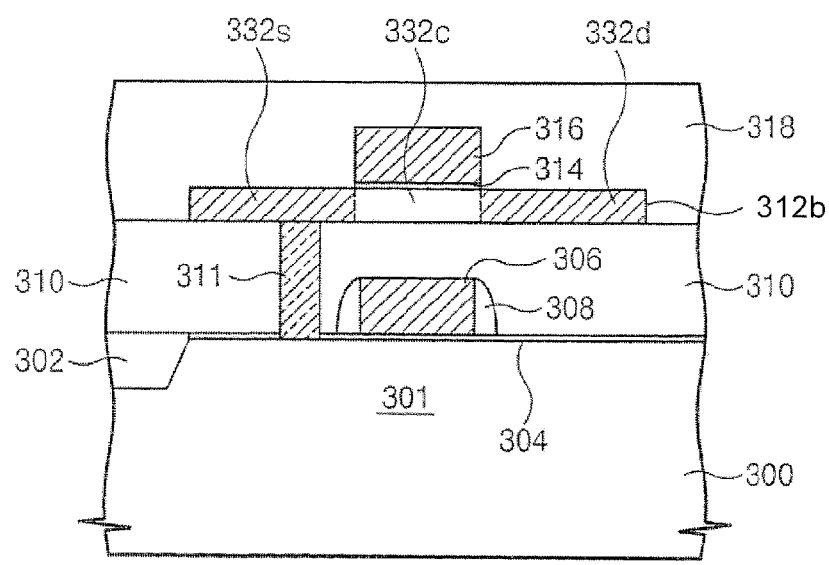
FIG. 12D is a cross-sectional view taken along a line VIII-VIII' of FIG. 12A.
Figure 13A:
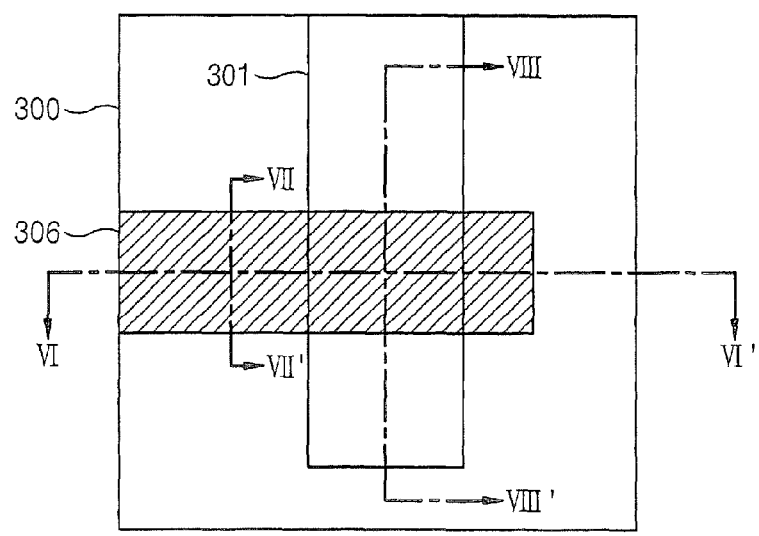
FIGS. 13A, 14A, 15A and 16A are plan views illustrating methods of fabricating semiconductor devices according to the embodiments of the invention.
Figure 13B:
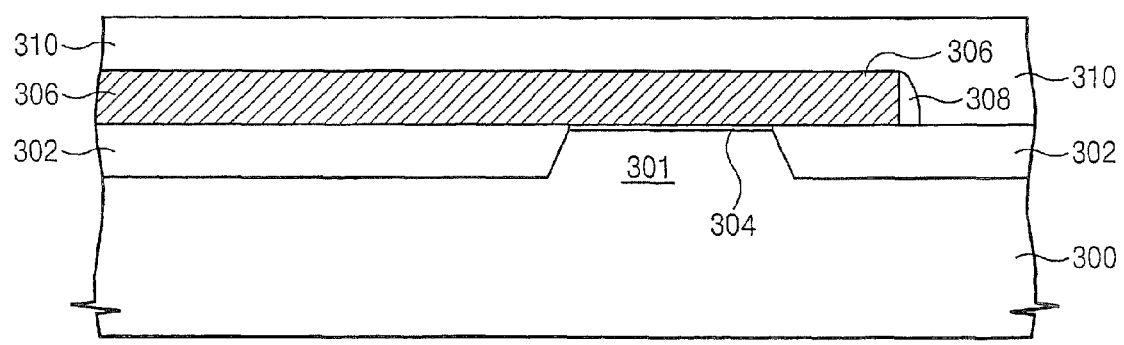
FIGS. 13B, 14B, 15B and 16B are cross-sectional views taken along lines VI-VI' of FIGS. 13A, 14A, 15A and 16A, respectively.
Figure 13C:
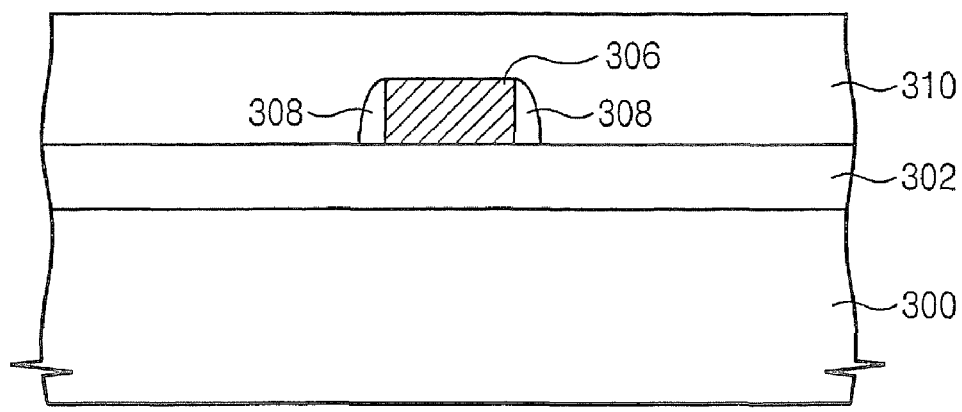
FIGS. 13C, 14C, 15C and 16C are cross-sectional views taken along lines VIII-VIII' of FIGS. 13A, 14A, 15A and 16A, respectively.
Figure 13D:
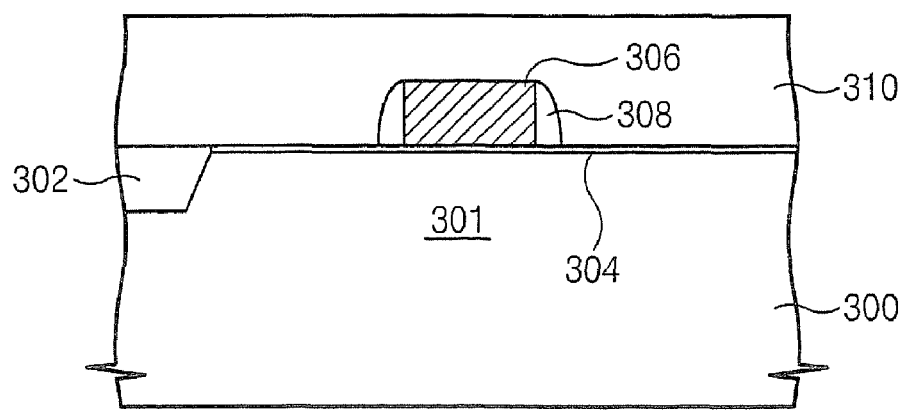
FIGS. 13D, 14D, 15D and 16D are cross-sectional views taken along lines VIII-VIII' of FIGS. 13A, 14A, 15A and 16A, respectively.
Figure 14A:
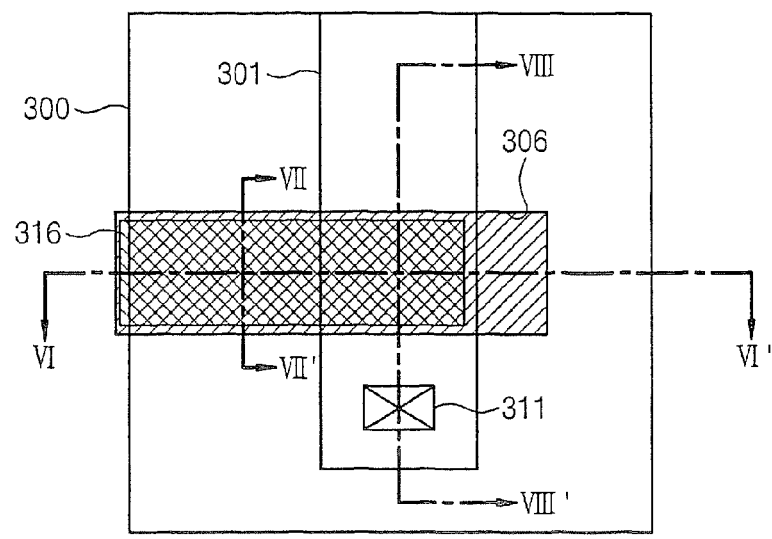
Figure 14B:
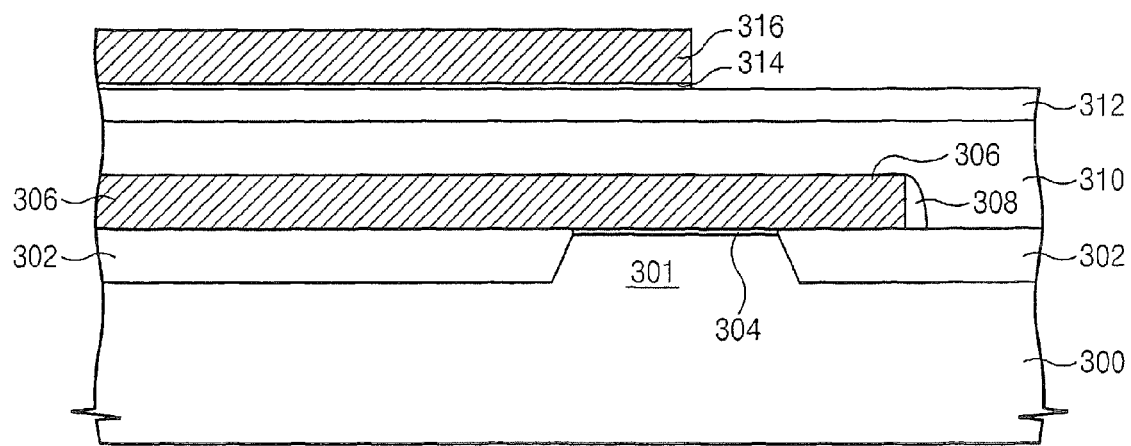
Figure 14C:
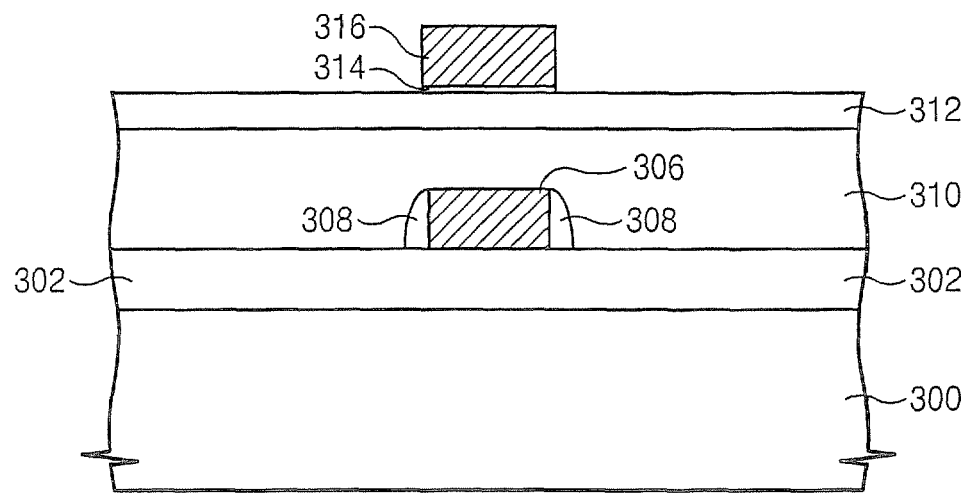
Figure 14D:
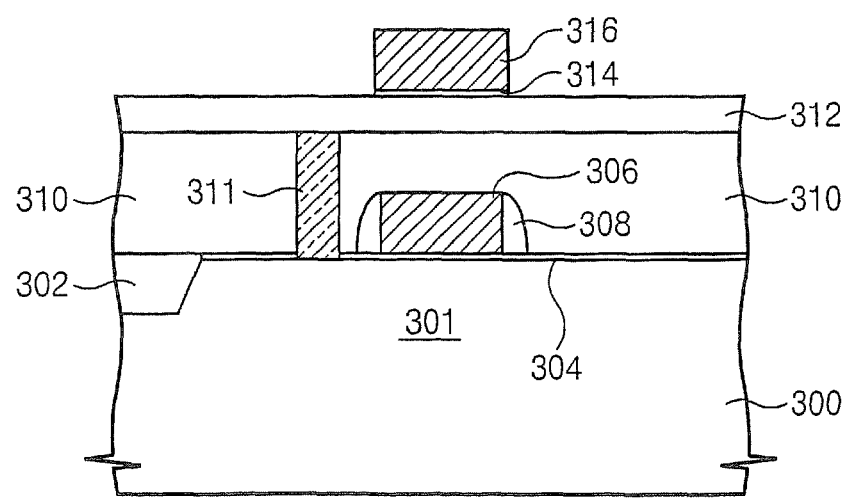
Figure 15A:
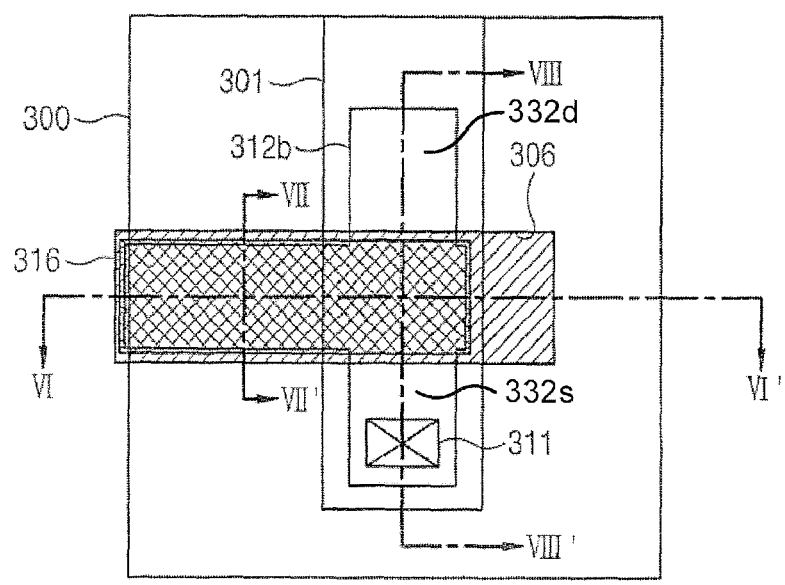
Figure 15B:
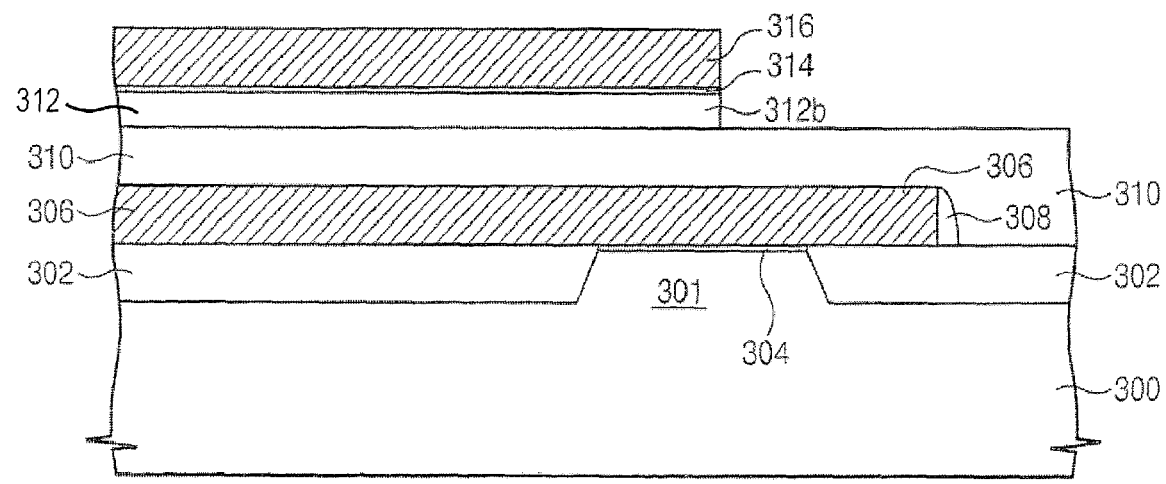
Figure 15C:
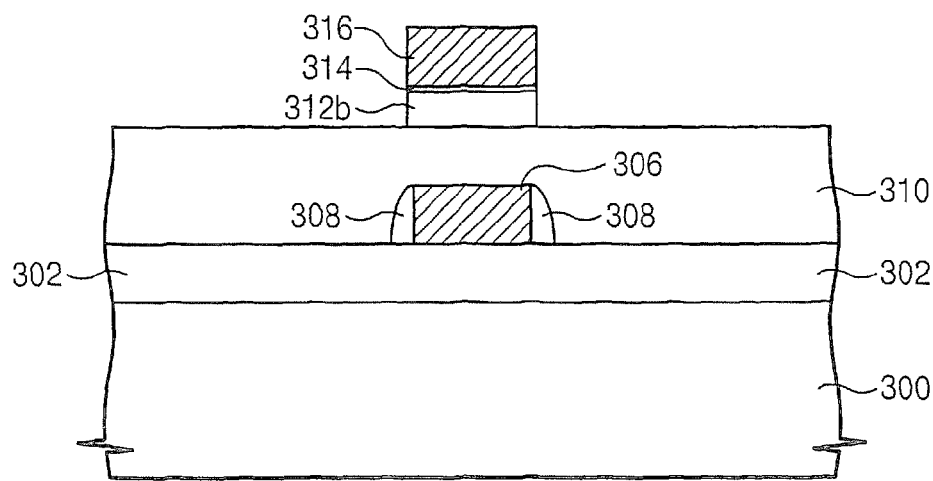
Figure 15D:
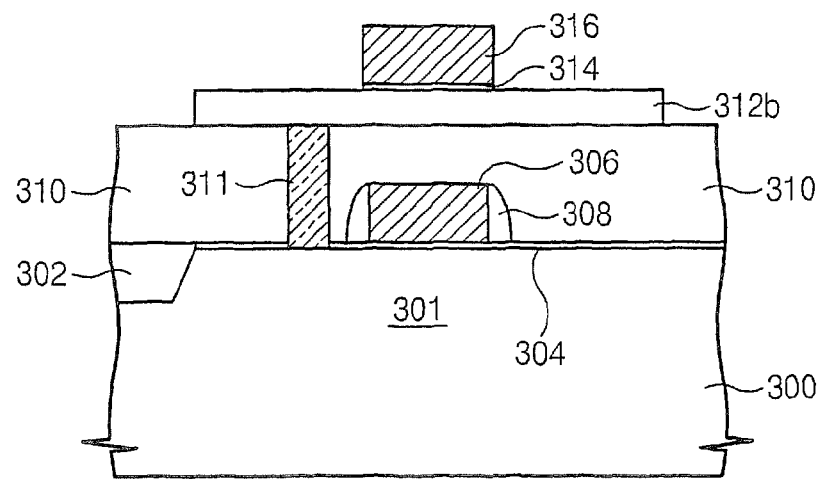
Figure 16A:
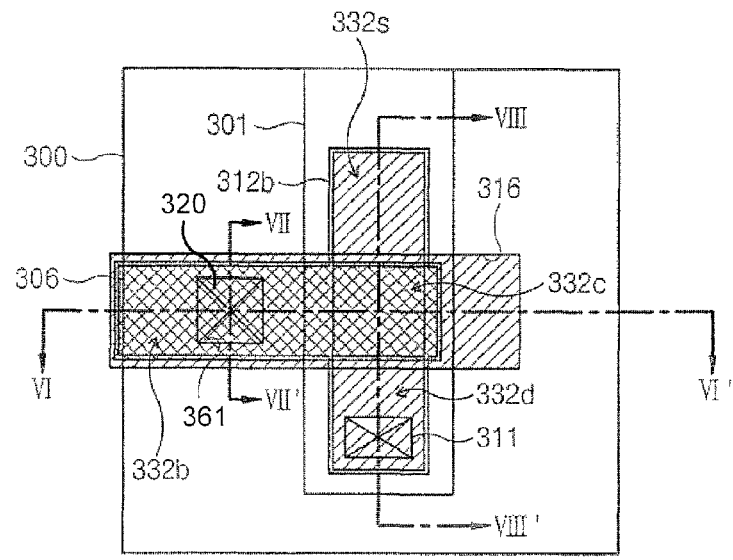
Figure 16B:
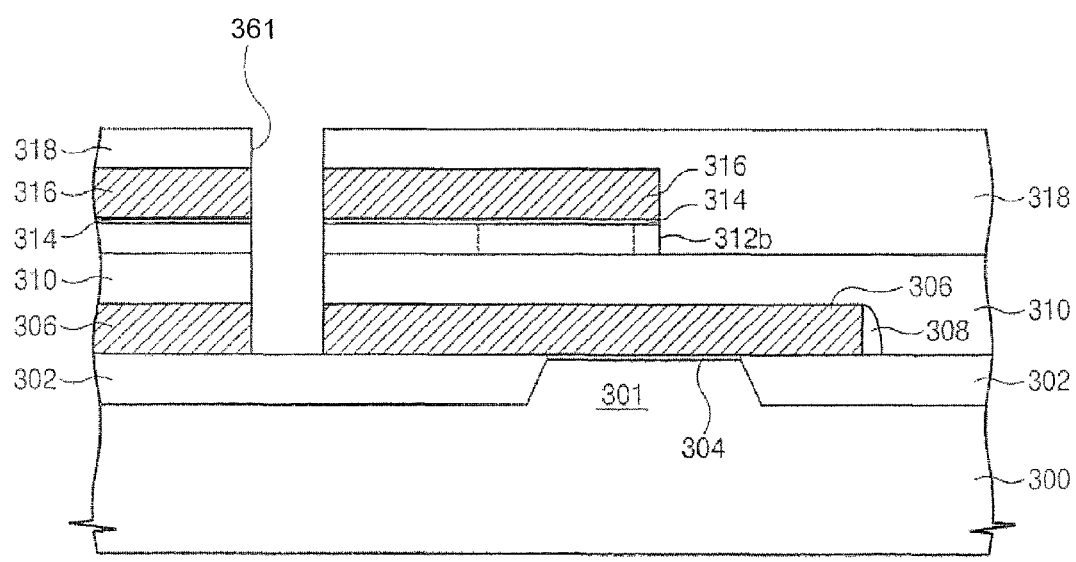
Figure 16C:
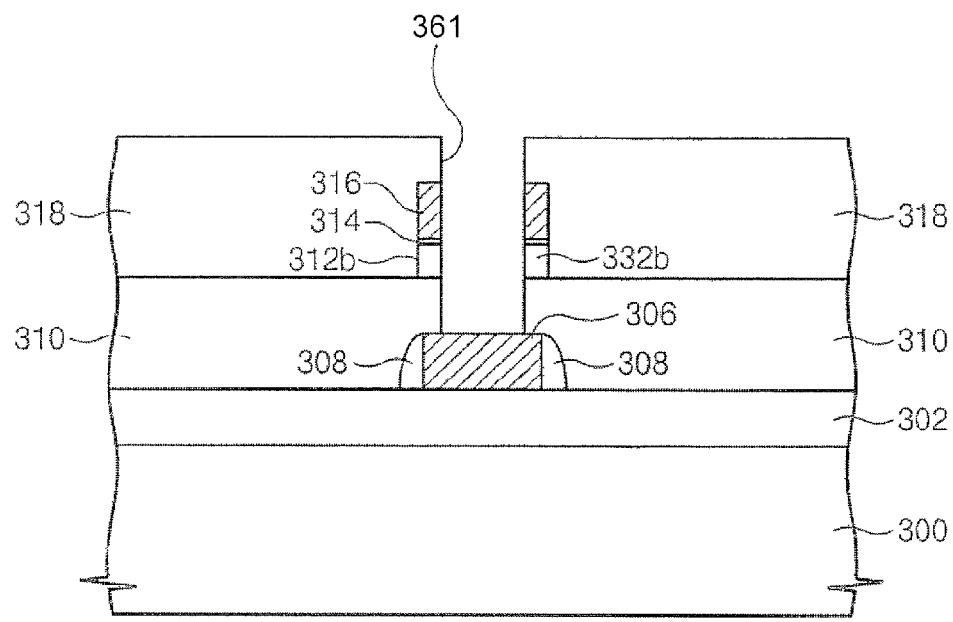
Figure 16D:
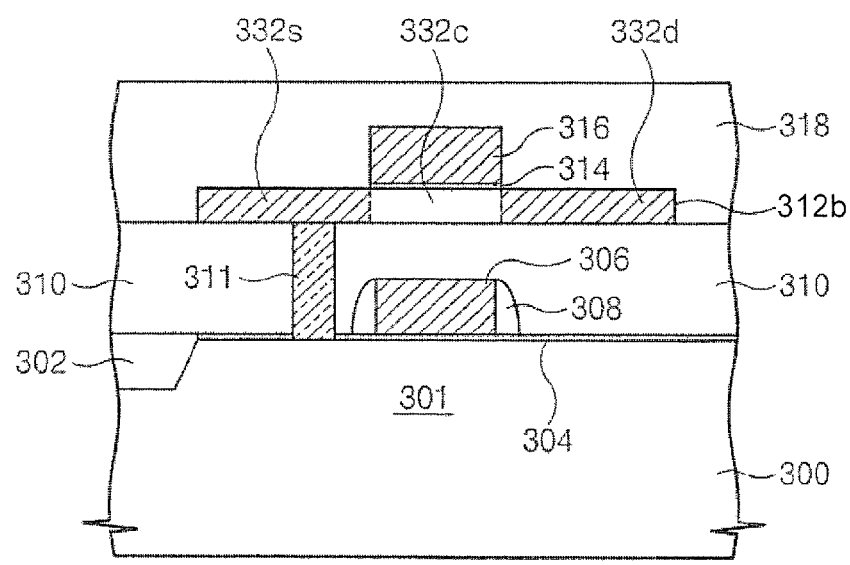
Figure 17A:
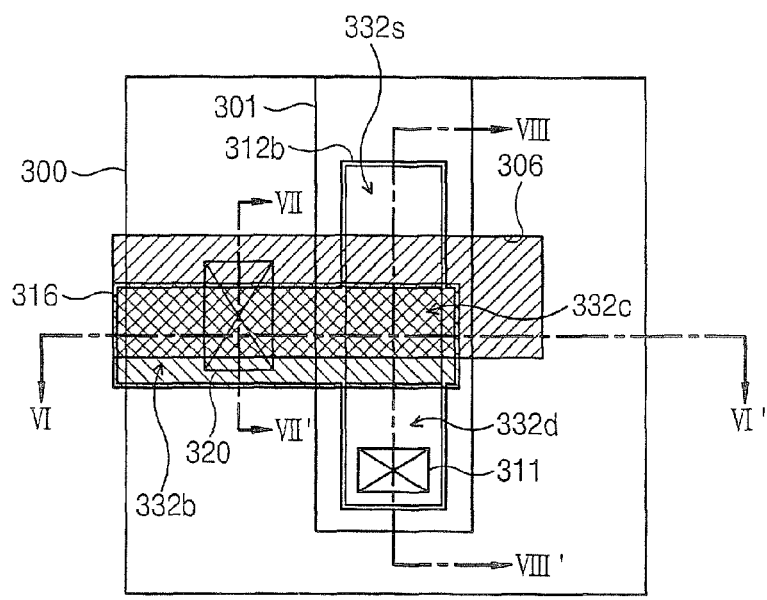
FIG. 17A, FIG. 17B, FIG. 17C, and FIG. 17D are diagrams explaining further embodiments of the invention.
Figure 17B:
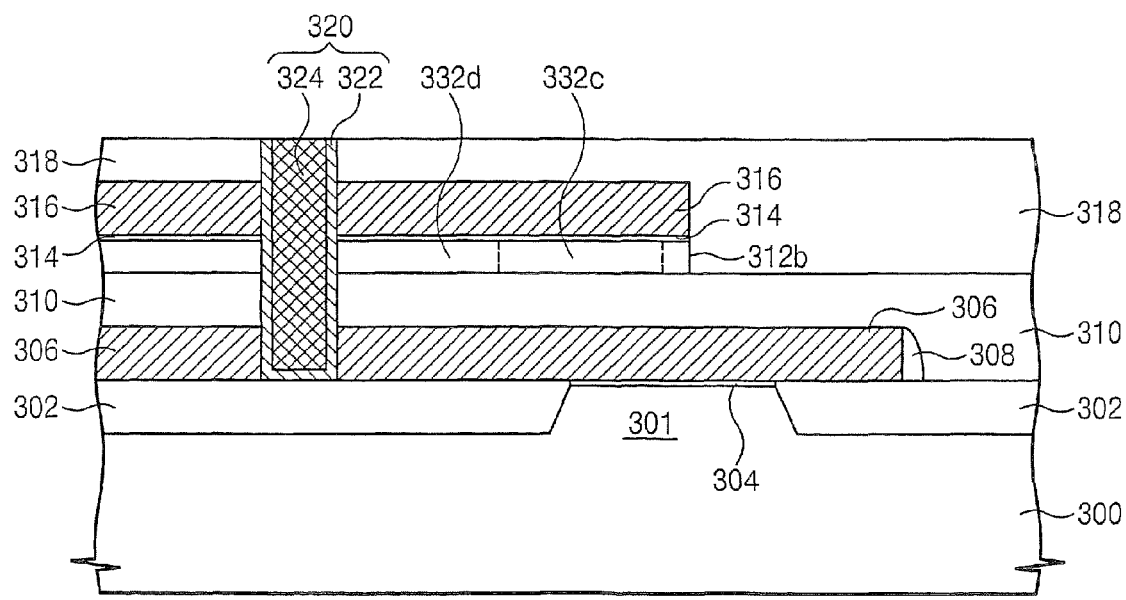
Figure 17C:
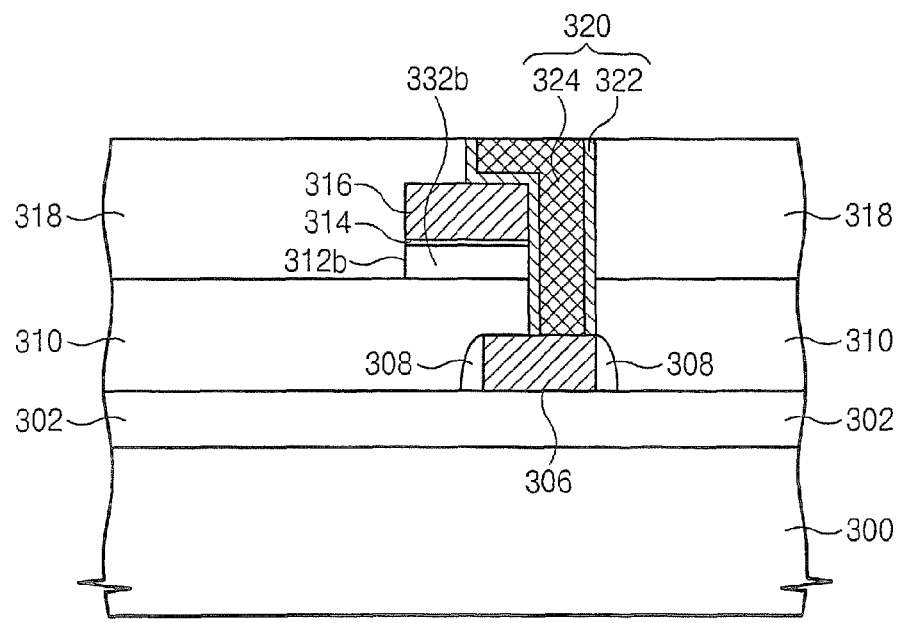
Figure 17D:
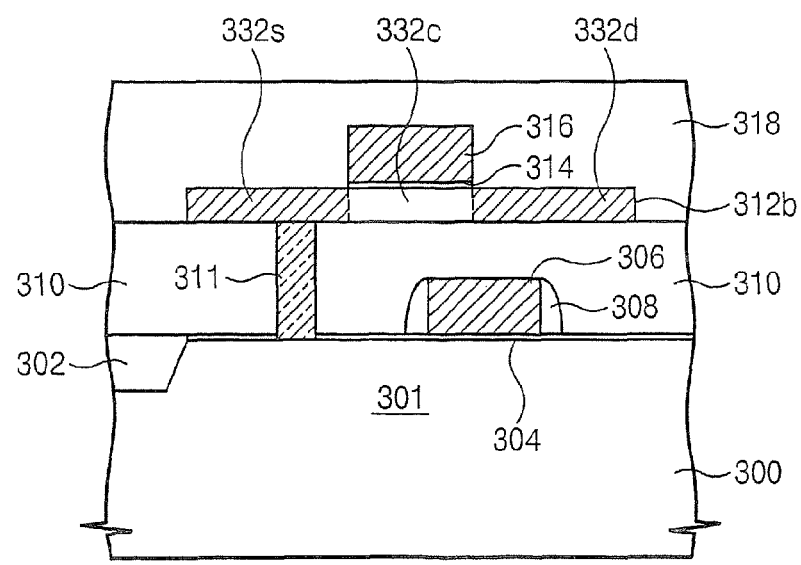

FIG. 12A is a plan view of a semiconductor device according to a further embodiments of the invention. FIG. 12B, FIG. 12C, and FIG. 12D are cross-sectional views taken along lines VI-VI', VII-VII', and VIII-VIII' of FIG. 12A, respectively.

As illustrated in the embodiments of FIG. 12A, FIG. 12B, FIG. 12C, and FIG. 12D, a semiconductor structure 290 having a driver transistor TR1 and a load transistor TR2 is illustrated. A device isolation layer 302 may be formed on a semiconductor substrate 300 to define an active region 301 of the driver transistor TR1. A lower gate pattern 306 of the driver transistor TR1 crosses over the active region 301. A gate insulation layer 304 may be interposed between the lower gate pattern 306 and the active region 301 of the driver transistor TR1.

A sidewall spacer 308 may be formed on a sidewall of the lower gate pattern 306 of the driver transistor TR1. An interlayer dielectric 310 may be formed on a surface of the substrate 300 where the lower gate pattern 306 is formed. A body region 312b of the load transistor TR2 may be formed on the interlayer dielectric 310. The body region 312b may have a portion laid over the lower gate pattern 306 of the driver transistor TR1. An upper gate pattern 316 of the load transistor TR2 may be formed on the body region 312b. An upper gate insulation layer 314 may be interposed between the upper gate pattern 316 and the body region 312b of the load transistor TR2. The body region 312b may be divided into portions extending to opposite sides of the upper gate pattern 316 and a portion extending along the upper gate pattern 316. A source region 332s and a drain region 332d of the load transistor TR2 may be formed in the portions of the body region 312b disposed on opposite sides of and adjacent to the upper gate pattern 316. A portion of the body region 312b between the source region 332s and the drain region 332d defines a channel region 332c of the load transistor TR2. A body region extension 332b extends along the upper gate pattern 316 away from the source region 332s and the drain region 332d. Accordingly, the body region extension 332b of the load transistor TR2 may extend from the end of the channel region 332c in a direction transverse to the orientation of the source region 332s and the drain region 332d.

A body contact 320 may be formed in the upper gate pattern 316 of the load transistor TR2 at a location spaced apart from the active region 301 of the driver transistor TR1 and from the source region 332s and the drain region 332d of the load transistor TR2. The body contact 320 may extend through the interlayer dielectric 310 to connect the upper gate pattern 316 of load transistor TR2 with the body region 312b of the load transistor TR2 and the lower gate pattern 306 of the driver transistor TR1. Thus, the gate electrodes of the driver transistor TR1 and the load transistor TR2 may be connected together, and the gate electrode of the load transistor TR2 may be connected to the body of the load transistor TR2, by the body contact 320.

The body contact 320 may be made, for example, of polysilicon or a metal pattern 324 (with or without an optional barrier metal layer 322 surrounding the metal pattern 324).

A portion of the body region 312b of the load transistor TR2 may be laid over the active region 301 of the driver transistor TR1. The source region 332s of the load transistor TR2 and the drain region of the driver transistor TR1 may be connected to a contact pattern 311 that extends through the interlayer dielectric 310.

FIG. 13A, 14A, 15A and FIG. 16A are top plan views illustrating methods of fabricating semiconductor devices according to some embodiments of the invention. FIG. 13B, 14B, 15B and FIG. 16B are cross-sectional views taken along lines VI-VI' of FIG. 13A, 14A, 15A and FIG. 16A, respectively. FIG. 13C, 14C, 15C and FIG. 16C are cross-sectional views taken along lines VII-VII' of FIG. 13A, 14A, 15A and FIG. 16A, respectively. FIG. 13D, 14D, 15D and FIG. 16D are cross-sectional views taken along lines VIII-VIII' of FIG. 13A, 14A, 15A and FIG. 16A, respectively.

As illustrated in FIG. 13A, FIG. 13B, FIG. 13C, and FIG. 13D, a device isolation layer 302 may be formed on a semiconductor substrate 300 to define an active region 301 of a driver transistor TR1. A gate insulation layer 304 may be formed on the active region 301. A lower gate pattern 306 may be formed on the gate insulation layer 304 to cross over the active region 301. A sidewall spacer 308 may be formed on sidewalls of the lower gate pattern 306. A capping layer (not shown) may be formed on the lower gate pattern 306. An interlayer dielectric 310 may be formed on a surface of the substrate 300 where the lower gate pattern 306 is formed.

As illustrated in FIG. 14A, FIG. 14B, FIG. 14C, and FIG. 14D, a contact pattern 311 may be formed to connect to the active region 301 of the driver transistor TR1 through the interlayer dielectric 310. A semiconductor layer 312 may be formed on the interlayer dielectric 310. A upper gate insulation layer 314 may be formed on the semiconductor layer 312. An upper gate pattern 316 of a load transistor TR2 may be formed on the upper gate insulation layer 314. The upper gate pattern 316 of the load transistor TR2 may have a portion disposed above the lower gate pattern 306 of the driver transistor TR1.

As illustrated in the embodiments of FIG. 15A, FIG. 15B, FIG. 15C, and FIG. 15D, a mask pattern (not shown) may be formed on the upper gate pattern 316 to cross over the upper gate pattern 316. Using the mask pattern and the upper gate pattern 316 as an etch mask, the semiconductor layer 312 may be etched to form a body region 312b. The body region 312b may include portions extending to opposite sides of the upper gate pattern 316 and a portion extending along the upper gate pattern 316.

As illustrated in the embodiments of FIG. 16A, FIG. 16B, FIG. 16C, and FIG. 16D, impurity atoms may be implanted into the portions of the body region 312b disposed at opposite sides of and adjacent to the upper gate pattern 316 to form a source region 332s and a drain region 332d of the load transistor TR2. In the embodiments illustrated in FIGS. 13A, 14A, 15A and 16A, source region 332s of the load transistor TR2 may be connected to the active region 301 of the driver transistor TR1 by contact pattern 311. However, those skilled in the art will appreciate that in other devices formed in accordance with the invention, the contact pattern 311 could, for example, be formed to connect the drain region 332d of transistor TR2 to the active region 301 of transistor TR1. A portion of the body region 312b lying between the source region 332s and the drain region 332d defines a channel region 332c. A portion of body region 312b extending along the upper gate pattern 316 away from channel region 332c is a body region extension 332b. The body region extension 332b may be doped with impurities of the same conductivity type as the channel region 332c. In some embodiments, the body region extension 332b may be more heavily doped than the channel region 332c.

As further illustrated in the embodiments of FIG. 16A, FIG. 16B, FIG. 16C, and FIG. 16D, an upper dielectric 318 may be formed on the resulting structure where the body region 312b is formed. A contact hole 361 may be formed through the upper dielectric 318, the upper gate pattern 316, the upper gate insulation layer 314, the body region 312b, the interlayer dielectric 310 to expose the lower gate pattern 306. In some embodiments, contact hole 361 may be formed to extend to, partially through, and/or completely through the lower gate pattern 306.

The contact hole 361 may be filled with a conductive material to form a body contact 320 (see FIG. 12B) to which the upper gate pattern 316 of the load transistor TR2, the body region 312b of the load transistor TR2, and the lower gate pattern 306 of the driver transistor TR1 are connected. Referring to FIG. 12B, the body contact 320 may be formed within and/or adjacent to, and in electrical contact with, the body region extension 332b. The body contact 320 may be made of polysilicon. Alternatively, the body contact 320 may include a metal pattern 324 and an optional barrier metal layer 322 surrounding the metal pattern 324, as illustrated in FIG. 12B.

FIG. 17A, FIG. 17B, FIG. 17C, and FIG. 17D illustrate alternatives to the embodiments illustrated in FIG. 16A, FIG. 16B, FIG. 16C, and FIG. 16D. In the embodiments illustrated in FIG. 17A, FIG. 17B, FIG. 17C, and FIG. 17D, the body contact 320 may be partially laid over the upper gate pattern 316. The upper gate pattern 316 may be offset from the lower gate pattern 306, so that the body contact 320 may be connected to the lower gate pattern 306. The body contact 320 may be connected to a surface of the upper gate pattern 316, a sidewall of the body region 312b, and a surface of the lower gate pattern 306.

Figure 18A:
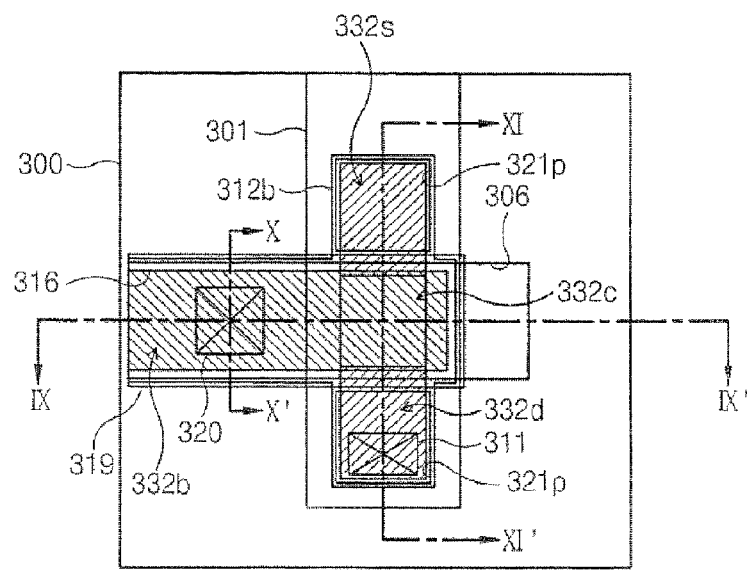
FIG. 18A is a plan view of semiconductor devices according to further embodiments of the invention.
Figure 18B:
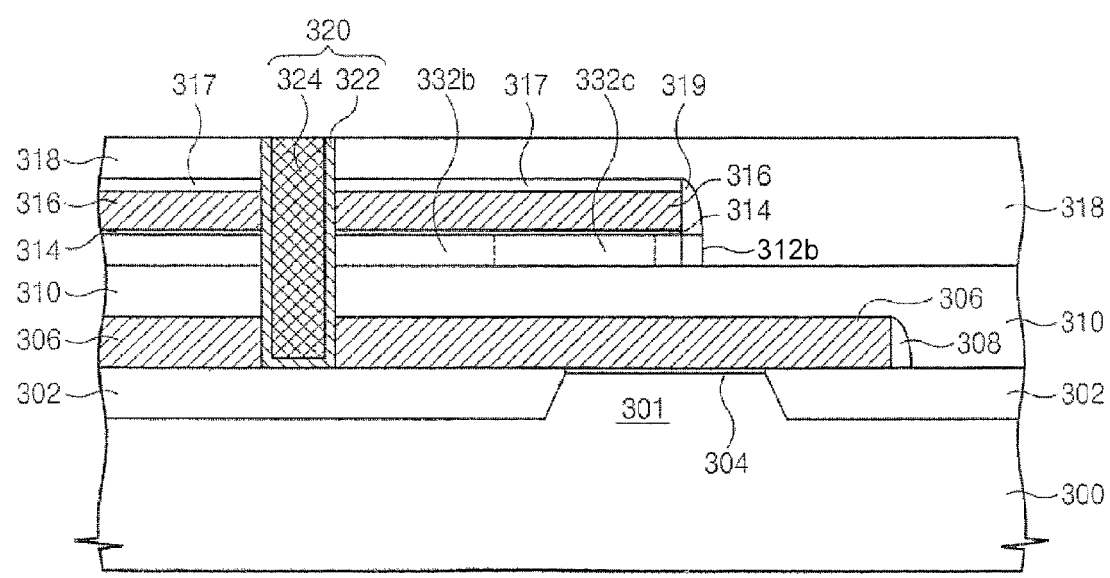
FIG. 18B, FIG. 18C, and FIG. 18D are cross-sectional views taken along lines IX-IX', X-X', and XI-XI' of FIG. 18A, respectively.
Figure 18C:
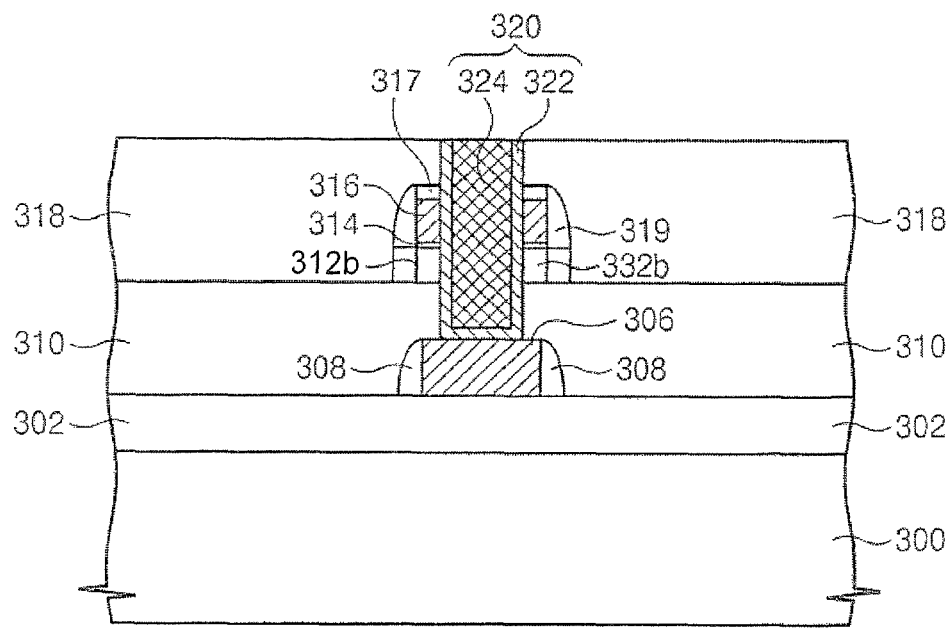
Figure 18D:
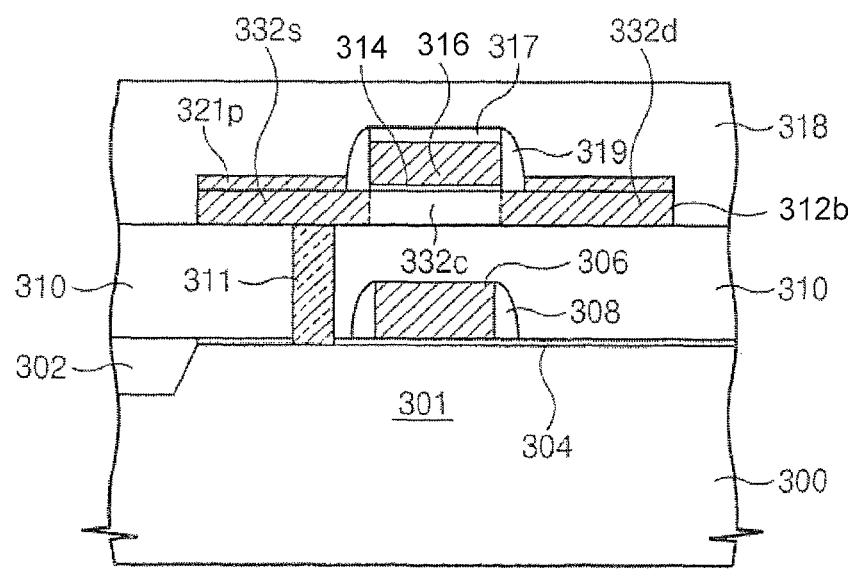
Figure 19A:
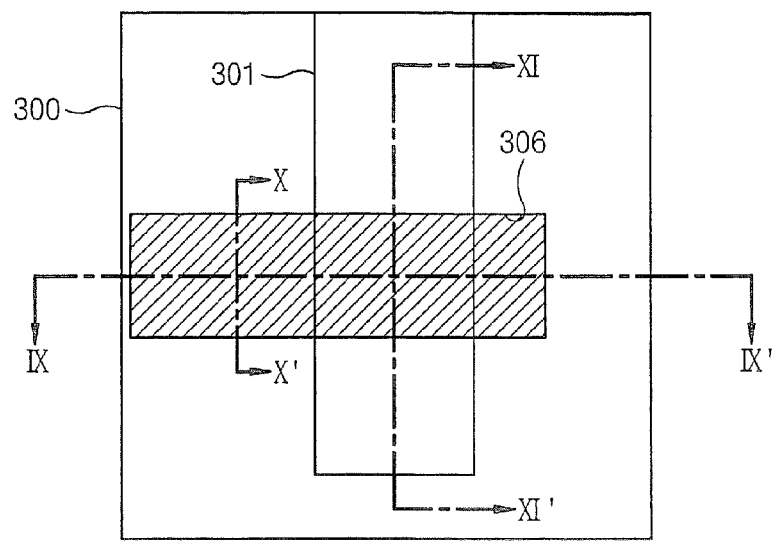
FIGS. 19A, 20A, 21A and 22A are plan views illustrating methods of fabricating semiconductor devices according to further embodiment of the invention.
Figure 19B:
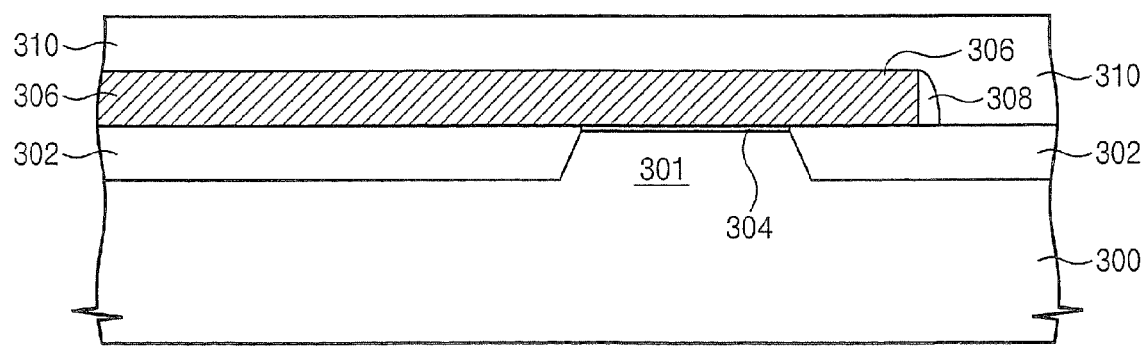
FIGS. 19B, 20B, 21B and 22B are cross-sectional views taken along lines IX-IX' of FIGS. 19A, 20A, 21A and 22A, respectively.
Figure 19C:
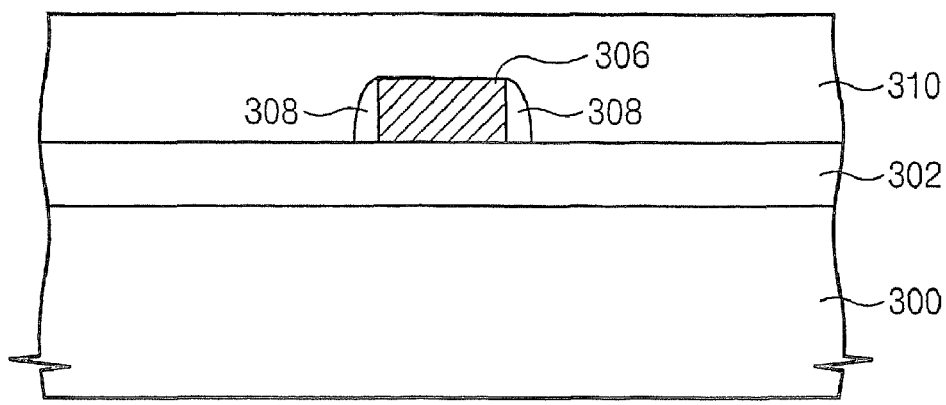
FIGS. 19C, 20C, 21C and 22C are cross-sectional views taken along lines X-X' of FIGS. 19A, 20A, 21A and 22A, respectively.
Figure 19D:
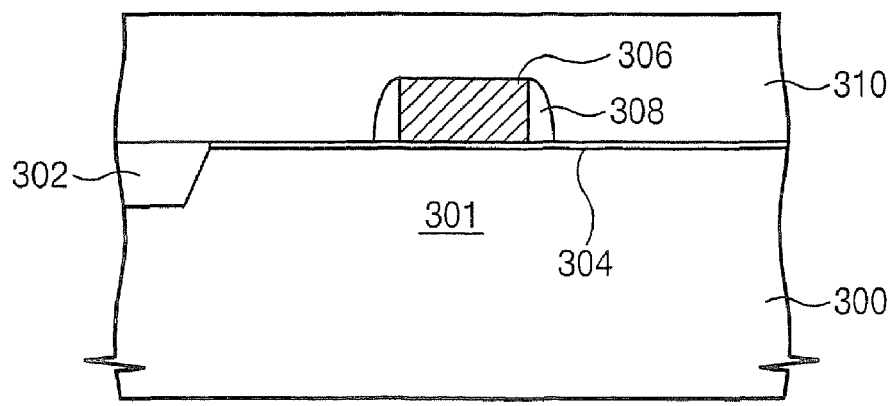
FIGS. 19D, 20D, 21D, and 22D are cross-sectional views taken along lines XI-XI' of FIGS. 19A, 20A, 21A and 22A, respectively.
Figure 20A:
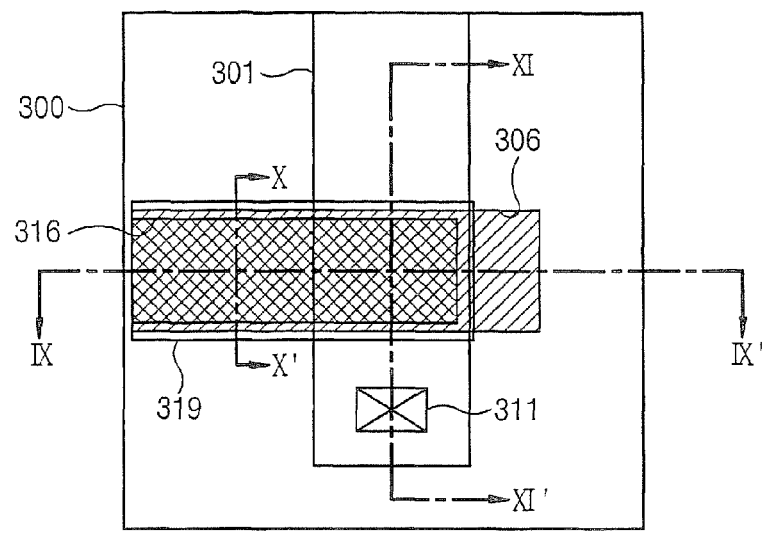
Figure 20B:
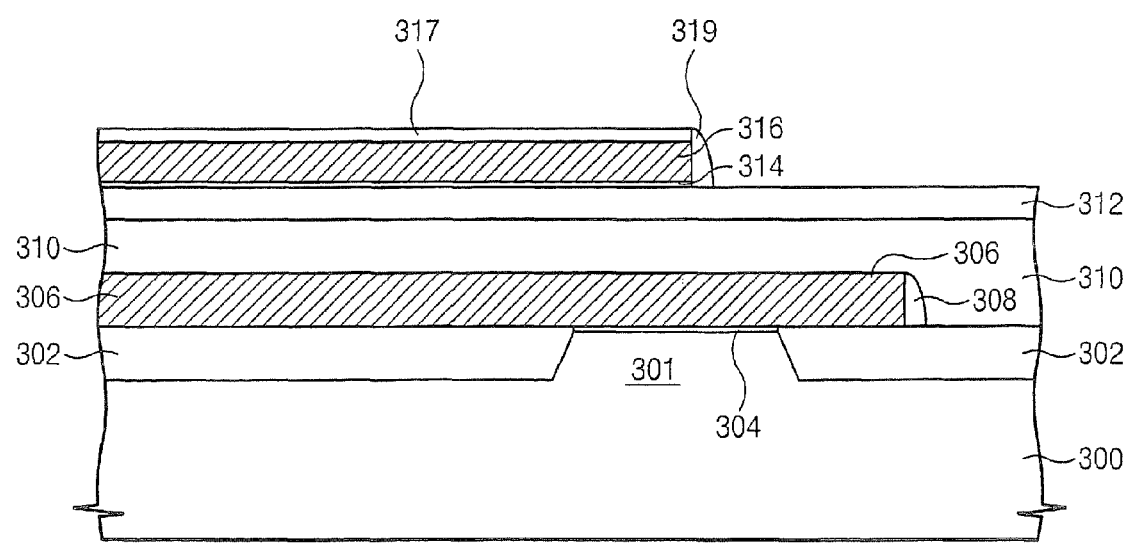
Figure 20C:
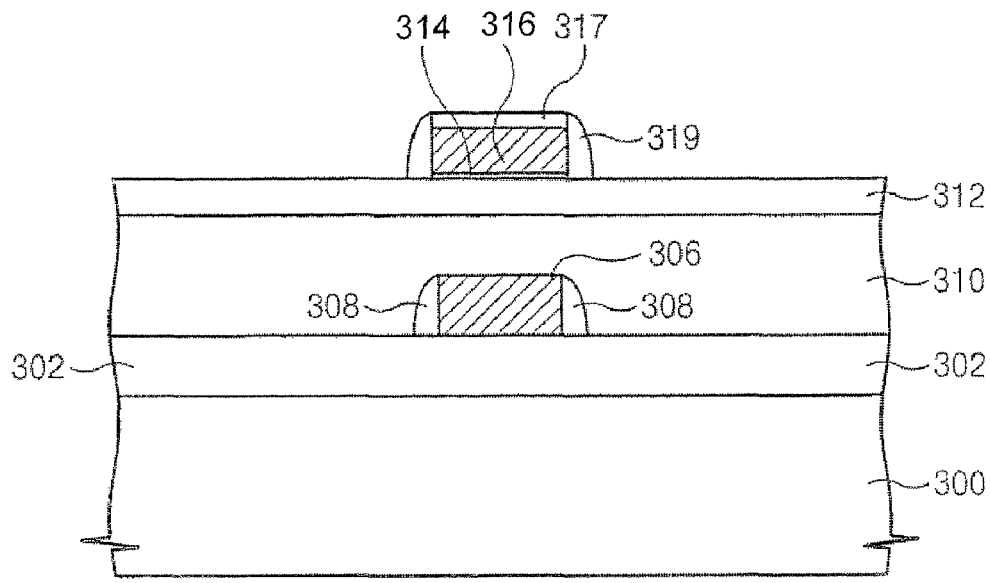
Figure 20D:
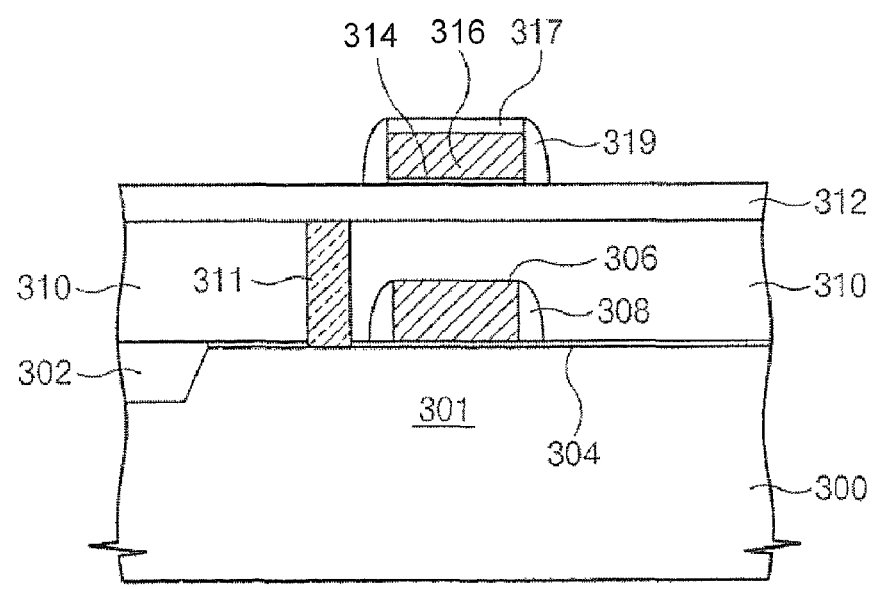
Figure 21A:
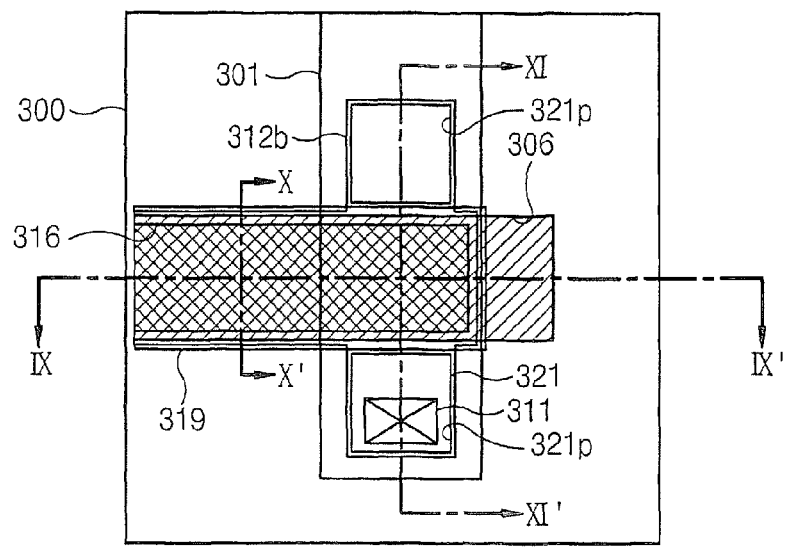
Figure 21B:
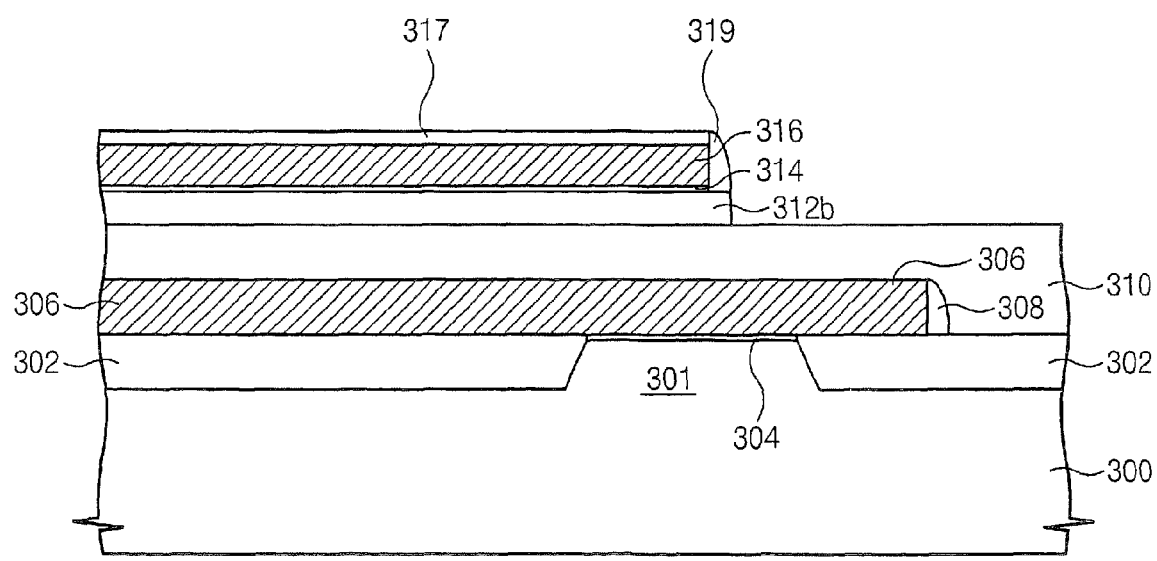
Figure 21C:
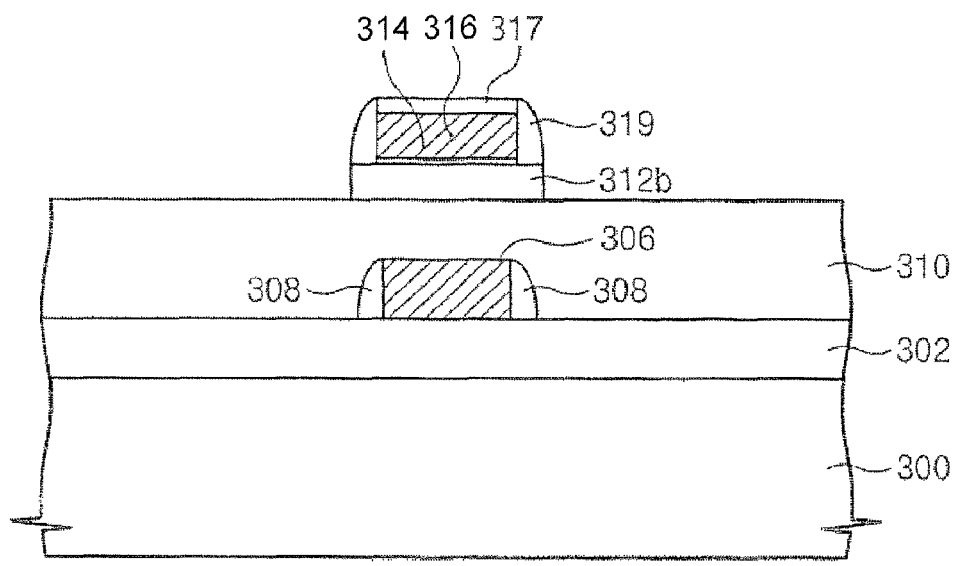
Figure 21D:
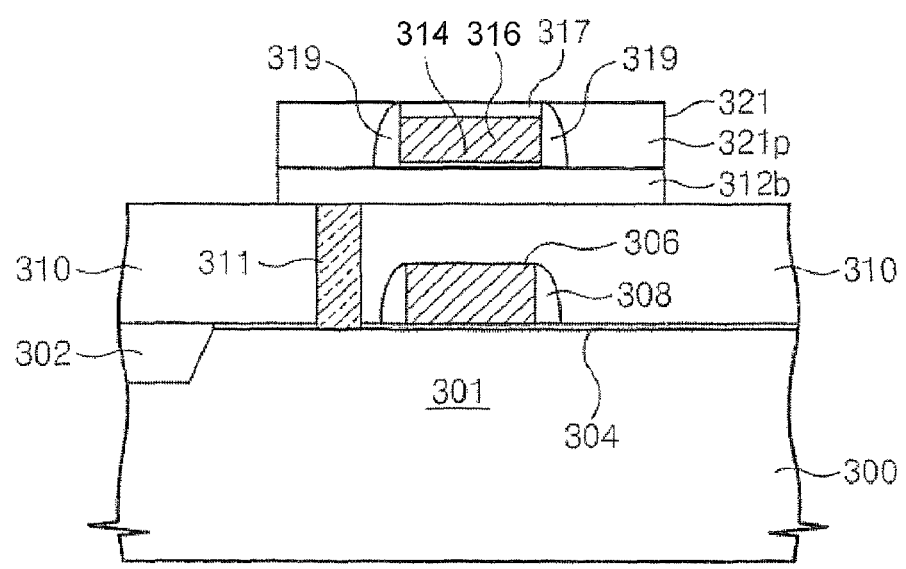
Figure 22A:
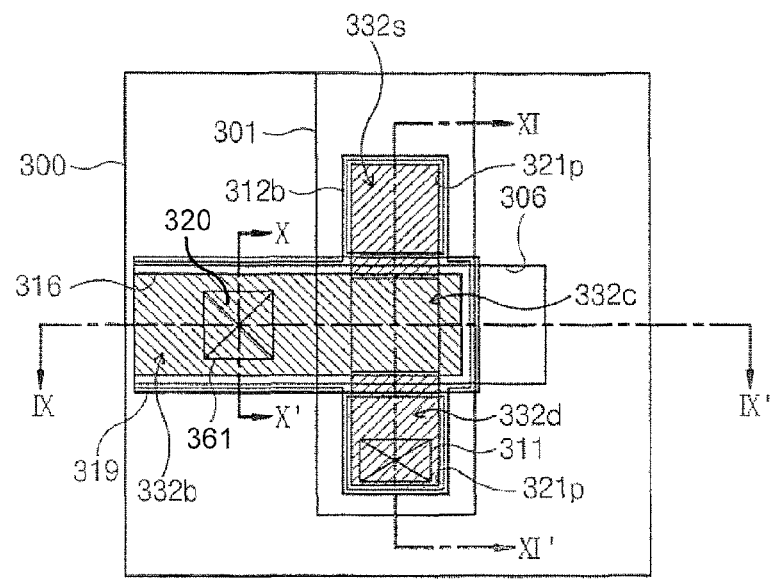
Figure 22B:
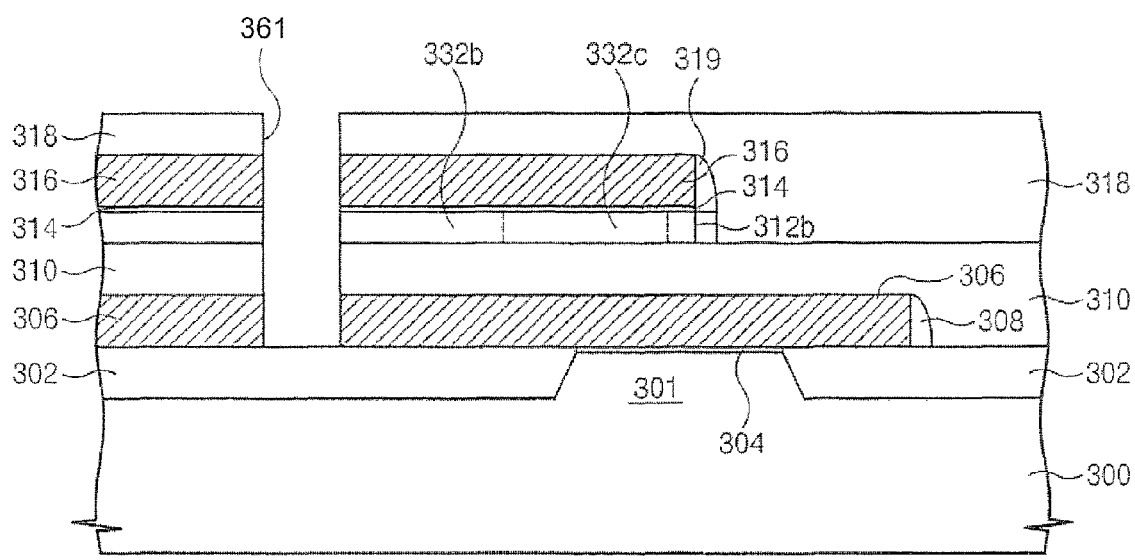
Figure 22C:
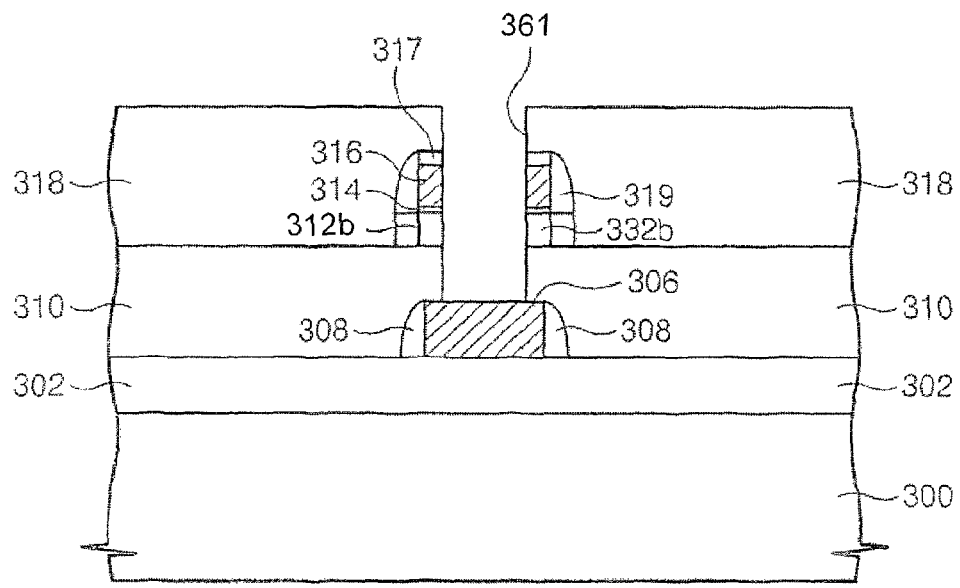
Figure 22D:
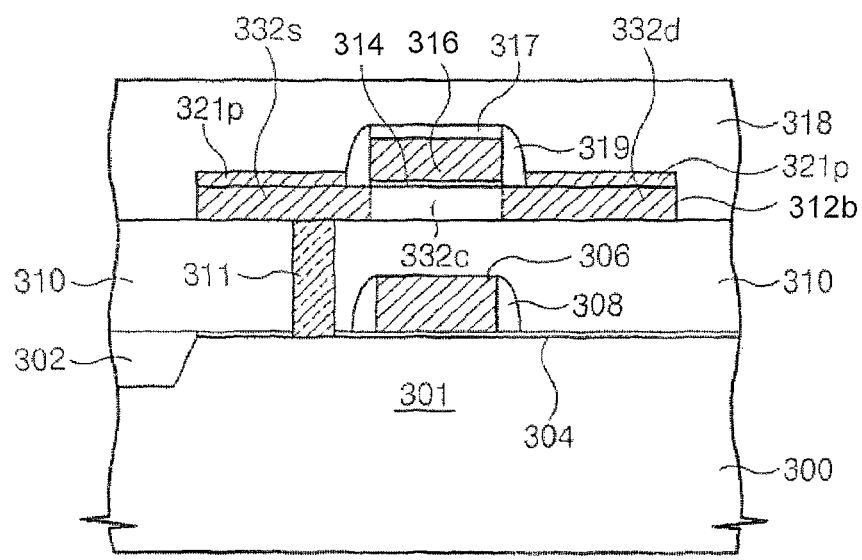

FIG. 18A is a plan view of a semiconductor device according to further embodiments of the invention. FIG. 18B, FIG. 18C, and FIG. 18D are cross-sectional views taken along lines IX-IX', X-X', and XI-XI' of FIG. 18A, respectively.

As illustrated in the embodiments of FIG. 18A, FIG. 18B, FIG. 18C, and FIG. 18D, a device isolation layer 302 may be formed on a substrate 300 to define an active region 301 of a driver transistor TR1. A lower gate pattern 306 may cross over the active region 301. A gate insulation layer 304 may be interposed between the lower gate pattern 306 and the active region 301.

A sidewall spacer 308 may be formed on a sidewall of the lower gate pattern 306. An interlayer dielectric 310 may be formed on a surface of the substrate 300 where the lower gate pattern 306 is formed. A body region 312b of a load transistor TR2 may be formed on the interlayer dielectric 310. The body region 312b may include a portion laid over the lower gate pattern 306 of the driver transistor TR1. An upper gate pattern 316 may be formed on the body region 312b. An upper gate insulation layer 314 may be interposed between the upper gate pattern 316 and the body region 312b. A capping layer 317 may be formed on the upper gate pattern 316. A sidewall spacer 319 may be formed on a sidewall of the upper gate pattern 316. The body region 312b may include portions extending to opposite sides of the upper gate pattern 316 and a portion extending along the upper gate pattern 316. A source region 332s and a drain region 332d may be formed in a portion of body region 312b disposed at opposite sides of and adjacent to the upper gate pattern 316. A portion of the body region 312b between the source region 332s and the drain region 332d forms a channel region 332c. The portion of body region 312b extending along the upper gate pattern 316 is a body region extension 332b which extends from an end of the channel region 332c.

As illustrated in FIG. 18D, a semiconductor pattern 321p may be formed on a portion of body region 312b outside the sidewall spacer 319, so that the source region 332s and the drain region 332d have a thickness greater than the body region extension 332b and the channel region 332c. An upper dielectric 318 may be formed on an entire surface of the structure substrate where the upper gate pattern 316 is formed. A body contact 320 may extend through the upper gate pattern 316 and the upper dielectric 318. The body contact 320 may be connected to the lower gate pattern 306 through the upper gate pattern 316, the body region extension 332b, and the interlayer dielectric 310. The body contact 320 may be made of polysilicon. Alternatively, the body contact 320 may include a metal pattern 324 and an optional barrier metal layer 322 to surround the metal pattern 324, as illustrated.

The body region 312b may have a portion laid over the active region 301. The body region 312b and the active region 301 may be connected to a contact pattern 311 through the interlayer dielectric 310. The body contact 320 may extend through or be partially laid over the upper gate pattern 316.

FIG. 19A, FIG. 20A, FIG. 21A and FIG. 22A are plan views illustrating methods of forming semiconductor devices according to further embodiments of the invention. FIG. 19B, FIG. 20B, FIG. 21B and FIG. 22B are cross-sectional views taken along lines IX-IX' of FIG. 19A, FIG. 20A, FIG. 21A and FIG. 22A, respectively. FIG. 19C, FIG. 20C, FIG. 21C and FIG. 22C are cross-sectional views taken along lines X-X' of FIG. 19A, FIG. 20A, FIG. 21A and FIG. 22A, respectively. FIG. 19D, FIG. 20D, FIG. 21D and FIG. 22D are cross-sectional views taken along lines XI-XI' of FIG. 19A, FIG. 20A, FIG. 21A and FIG. 22A, respectively.

As illustrated in the embodiments of FIG. 19A, FIG. 19B, FIG. 19C, and FIG. 19D, a device isolation layer 302 may be formed on a semiconductor substrate 300 to define an active region 301 of a driver transistor TR1. A gate insulation layer 304 may be formed on the active region 301. A lower gate pattern 306 may be formed on the gate insulation layer 304 to cross over the active region 301. A sidewall spacer 308 may be formed adjacent to the lower gate pattern 306. A capping layer (not shown) may be formed on the lower gate pattern 306. An interlayer dielectric 310 may be formed on an entire surface of a substrate 300 where the lower gate pattern 306 is formed.

As illustrated in the embodiments of FIG. 20A, FIG. 20B, FIG. 20C, and FIG. 20D, a contact pattern 311 may be formed through the interlayer dielectric 310 to the active region 301 of the driver transistor TR1.

A semiconductor layer 312 may be formed on the interlayer dielectric 310. An upper gate insulation layer 314 may be formed on the semiconductor layer 312. An upper gate pattern 316 may be formed on the upper gate insulation layer 314. The upper gate pattern 316 may have a portion laid over the lower gate pattern 306. A capping layer 317 may be formed on the upper gate pattern 316. A sidewall spacer 319 may be formed on a sidewall of the upper gate pattern 316. Prior to formation of the sidewall spacer 319, a lightly doped diffusion layer and/or a halo diffusion layer may be formed at opposite sides of and adjacent to the upper gate pattern 316.

As illustrated in the embodiments of FIG. 21A, FIG. 21B, FIG. 21C, and FIG. 21D, an upper semiconductor layer 321 may be formed on the semiconductor substrate 300 where the upper gate pattern 316 is formed. The upper semiconductor layer 321 may be thinned (e.g., by etch-back or chemical-mechanical polishing) to expose the capping layer 317 of the upper gate pattern 316. The upper semiconductor layer may be patterned to form a mask pattern 321p at opposite sides of and adjacent to the upper gate pattern 316. Using the upper gate pattern 316 including the sidewall spacer 319 and the mask pattern 321p as an etch mask, the semiconductor layer 312 may be patterned to form a body region 312b. The body region 312b may include a portion extending to opposite sides of the upper gate pattern 316 and a portion extending along the upper gate pattern 316.

As illustrated in the embodiments of FIG. 22A, FIG. 22B, FIG. 22C, and FIG. 22D, a top of the mask pattern 321p may be recessed to remove an impurity-implanted portion. As a result, semiconductor pattern 321p may remain on the body region 312b disposed at opposite sides of and adjacent to the upper gate pattern 316. Portions of the body region 312b disposed at opposite sides of and adjacent to the upper gate pattern 316 may be selectively doped (e.g., by ion implantation) to form a source region 332s and a drain region 332d of the load transistor TR2. The source region 332s of the load transistor TR2 may be electrically connected to the active region 301 of the driver transistor TR1 by a contact pattern 311. A portion of the body region between the source region 332s and the drain region 332d defines a channel region 332c. A portion of the body region 312b extending along the upper gate pattern 316 is a body region extension 332b. Body region extension 332b is formed in a portion of the body region 312b extending from the end of the channel region 332c and away from the source region 332s and the drain region 332d. The body region extension 332b may be doped with impurity atoms of the same conductivity type as the channel region 332c. In some embodiments, the body region extension 332b may be doped more heavily than the channel region 332c.

An upper dielectric 318 may be formed on an entire surface of the resulting structure where the body region 312b is formed. A contact hole 361 may be formed through the upper dielectric 318, the upper gate pattern 316, the upper gate insulation layer 314, the body region 312b, and the interlayer dielectric 310 to expose the lower gate pattern 306. As shown in FIG. 12B, the contact hole 361 may be filled with a conductive material to form a body contact 320 that is connected to the upper gate pattern 316 and the body region 312b of the load transistor TR2, and the lower gate pattern 306 of the driver transistor TR1. The body contact 320 may be made of polysilicon. Alternatively, as shown in FIG. 12B, the body contact 320 may include a metal pattern 324 and an optional barrier metal layer 322 surrounding the metal pattern 324, as illustrated. The body contact 320 is formed at the body region extension 332*b*.

Embodiments of the invention may provide a semiconductor device having a body region to which a body contact is connected. The body contact may be formed to contact a body region extension that extends from the end of a channel region of the device. Thus, in some embodiments according to the invention, a conventional process of forming a partially insulated body region may not be required. In some embodiments of the invention, a body region of a semiconductor device may be formed using a gate pattern as an etch mask to reduce the possibility of an alignment error that could cause a source and/or drain region to become short-circuited.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
   forming a gate pattern on a semiconductor layer;
   forming a mask pattern on portions of the semiconductor layer disposed on opposite sides of and adjacent to the gate pattern;
   etching the semiconductor layer using the mask pattern and the gate pattern as an etch mask to form a body region having a sidewall aligned with a sidewall of the gate pattern, the body region including a body region extension extending beneath the gate pattern and away from the portion of the body region defined by the mask pattern;
   selectively doping second and third portions of the body region disposed on the opposite sides of and adjacent to the gate pattern to form a source region and a drain region and to define a channel region between the source region and the drain region; and
   forming a contact to electrically connect the gate pattern to the body region extension.

2. The method of claim 1, further comprising selectively doping the body region extension.

3. The method of claim 1, wherein forming the mask pattern comprises:
   forming a sidewall spacer on the sidewall of the gate pattern;
   forming a capping layer on the gate pattern;
   forming a semiconductor mask layer to cover the gate pattern and the portions of the semiconductor layer around the gate pattern;
   thinning the semiconductor mask layer to expose the capping layer; and
   patterning the semiconductor mask layer to form the mask pattern covering the portions of the semiconductor layer disposed on the opposite sides of and adjacent to the gate pattern.

4. The method of claim 3, wherein thinning the semiconductor mask layer comprises chemical-mechanical polishing the semiconductor mask layer.

5. The method of claim 3, further comprising:
   implanting impurities into the semiconductor mask pattern and the body region extension; and
   removing a top of the mask pattern to form a semiconductor pattern on the body region.

* * * * *